(12) United States Patent
Nair et al.

(10) Patent No.: US 6,781,834 B2
(45) Date of Patent: Aug. 24, 2004

(54) COOLING DEVICE WITH AIR SHOWER

(75) Inventors: Manu Kumar Velayudhan Nair, Bangalore (IN); Frederick Rajendran Ravikumar, Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 62 days.

(21) Appl. No.: 10/350,531

(22) Filed: Jan. 24, 2003

(65) Prior Publication Data

US 2004/0145868 A1 Jul. 29, 2004

(51) Int. Cl.[7] .................................................. H05K 7/20
(52) U.S. Cl. ...................... 361/697; 165/80.3; 165/121; 165/185; 165/908; 257/722; 361/695; 361/703; 454/186
(58) Field of Search ................................ 165/80.3, 121, 165/122, 126, 185, 908; 257/722; 361/687–710, 715; 454/184

(56) References Cited

U.S. PATENT DOCUMENTS

| | | | | |
|---|---|---|---|---|
| 4,851,965 A | * | 7/1989 | Gabuzda et al. ............ 361/691 |
| 5,195,576 A | * | 3/1993 | Hatada et al. ............. 165/80.3 |
| 5,563,768 A | * | 10/1996 | Perdue ....................... 361/695 |
| 5,810,072 A | * | 9/1998 | Rees et al. ................. 165/80.3 |
| 6,000,908 A | * | 12/1999 | Bunker ........................ 416/95 |
| 6,650,838 B2 | * | 11/2003 | Tanaka et al. ............. 396/539 |

* cited by examiner

Primary Examiner—Gregory Thompson
(74) Attorney, Agent, or Firm—Trueman H. Denny, III

(57) ABSTRACT

A cooling device with an air shower is disclosed. The cooling device includes a heat mass with a plurality of spaced apart fins connected therewith. An air shower including an injector face with a plurality of disrupter orifices is positioned over the fins so that the disrupter orifices direct a second air flow into slots between adjacent fins. A first air flow flowing through the slots is impinged upon and is disrupted by the second air flow resulting in the generation of turbulence in the first air flow. Consequently, a thermal boundary layer in the first air flow is disrupted and a rate,of heat transfer from the fins and the heat mass are increased.

23 Claims, 16 Drawing Sheets

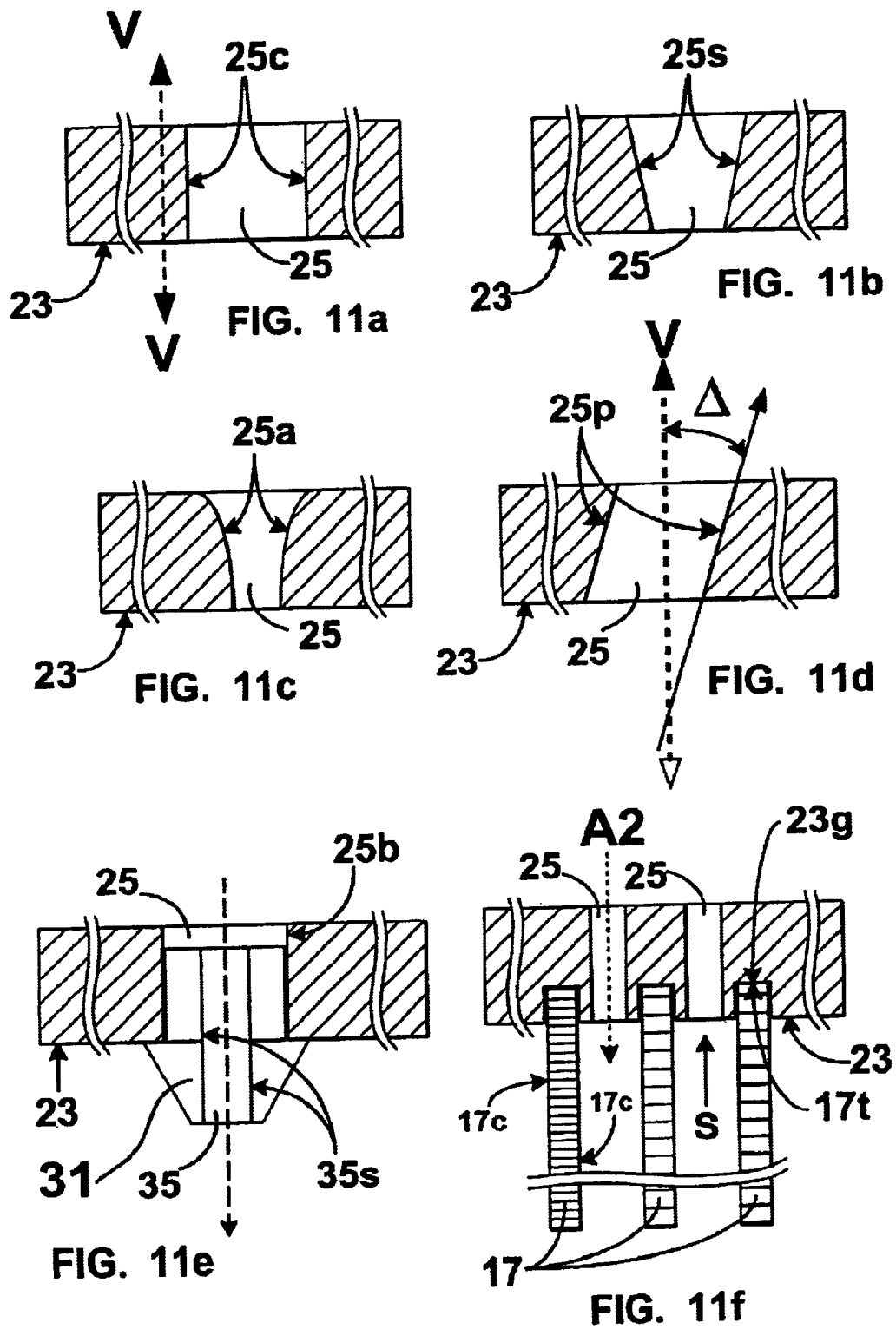

COOLING DEVICE WITH AIR SHOWER

FIELD OF THE INVENTION

The present invention relates generally to a cooling device including an air impingement chamber. More specifically, the present invention relates to a cooling device including an air impingement chamber that disrupts an air flow through the cooling device so that air turbulence is increased with a resulting increase in heat transfer from the cooling device to the air flow.

BACKGROUND OF THE INVENTION

It is well known in the electronics art to place a heat sink in contact with an electronic device so that waste heat generated by operation of the electronic device is thermally transferred into the heat sink thereby cooling the electronic device. With the advent of high clock speed electronic devices such as microprocessors ($\mu$p), digital signal processors (DSP), and application specific integrated circuits (ASIC), the amount of waste heat generated by those electronic devices and the operating temperature of those electronic devices are directly proportional to clock speed. Therefore, higher clock speeds result in increased waste heat generation which in turn increases the operating temperature of the electronic device. However, efficient operation of the electronic device requires that waste heat be continuously and effectively removed.

Heat sink devices came into common use as a preferred means for dissipating waste heat from electronic devices such as the types described above. In a typical application, a component to be cooled is carried by a connector that is mounted on a PC board. A heat sink is mounted on the component by attaching the heat sink to the connector using a clip or fasteners, for example. Attentively, the heat sink is mounted to a PC board that carries the electronic device and fasteners or the like are used to connect the heat sink to the PC board via holes that are drilled in the PC board.

Typically, a heat sink used in conjunction with a modem high clock speed electronic device will use an electrical fan connected with the heat sink and operative to supply an air flow over a plurality of cooling finstvanes of the heat sink. The cooling fins/vanes increase a surface area of the heat sink and maximize heat transfer from the heat sink to ambient air that surrounds the heat sink. The fan causes air to circulate over and around the cooling fins thereby transferring heat from the cooling fins into the ambient air.

As mentioned previously, with continuing increases in clock speed, the amount of waste heat generated by electronic devices has also increased. Accordingly, to adequately cool those electronic devices, larger heat sinks and/or larger fans are required. Increasing the size of the heat sink results in a greater thermal mass and a greater surface area from which the heat can be dissipated. Increases in fan size provide for more air flow through the cooling fins.

There are disadvantages to increased fan and heat sink size. First, if the size of the heat sink is increased in a vertical direction (i.e. in a direction transverse to the PC board), then the heat sink will be taller and may not fit within a vertical space in the system that carries the heat sink, such as the chassis of a desktop computer, for example.

Second, if the PC board has a vertical orientation, then a heavy and tall heat sink can mechanically stress the PC board and/or the electronic device resulting in a device or PC board failure.

Third, a tall heat sink will require additional vertical clearance between the heat sink and a chassis the heat sink is contained in to allow for adequate air flow into or out of the fan.

Finally, increases in fan size to increase cooling capacity often result in increased noise generation by the fan. In many applications such as the desktop computer or a portable computer, it is highly desirable to minimize noise generation. Moreover, in portable applications that depend on a battery to supply power, the increased power drain of a larger fan is not an acceptable solution for removing waste heat.

Another disadvantage of prior cooling devices is that the air flow over the fins/vanes can be non-turbulent. Although a non-turbulent air flow can result in reduced air flow noise, it can also create a thermal boundary layer that reduces heat transfer from the fins/vanes into the air flow thereby reducing a heat transfer rate from the cooling device into the ambient air.

Consequently, there exists a need for a cooling device that takes advantage of increased air turbulence in order to disrupt a thermal boundary layer and to increase a heat transfer rate from the cooling device to an air flow through the cooling device. There is also a need for a cooling device in which the heat transfer rate can be increased without having to increase a surface area of the cooling device, a mass of the cooling device, or a rate of air flow through the cooling device.

SUMMARY OF THE INVENTION

Broadly, the present invention is embodied in a cooling device with an air impingement chamber for dissipating heat from a component. Typically, the component is an electronic component or an electronic device; however, the cooling device of the present invention can be used in conjunction with any heat producing device and is not limited to use with electronic devices or components.

Broadly, the present invention is embodied in a cooling device for dissipating heat from a component. The component can be any component requiring the removal of heat. The cooling device includes a heat mass with a top surface and a mounting surface adapted to thermally connect the heat mass with the component to be cooled. A plurality of fins are connected with the top surface of the heat mass and are substantially aligned with a vertical axis of the heat mass. Each fin includes opposed side surfaces, a top edge, a leading edge, and a trailing edge and the fins are spaced apart from one another to define a plurality of slots between adjacent fins. The slots are substantially aligned with a longitudinal axis of the heat mass.

The cooling device also includes an air shower with an air inlet that extends into the air shower to define an air impingement chamber. The air shower includes an injector face and a plurality of disrupter orifices extending from the air impingement chamber to the injector face. The injector face is positioned adjacent to the top edges of the fins so that disrupter orifices are positioned over the slots.

A second air flow enters the air impingement chamber through the air inlet and exits the air impingement chamber through the disrupter orifices. The second air flow enters the slots between the fins and impinges on a first air flow flowing through the slots. The second air flow induces turbulence in the first air flow and that turbulence is operative to disrupt a thermal boundary layer in the first air flow thereby increasing a rate of heat transfer from the fins and the heat mass to the first air flow.

As a result, heat is more efficiently removed from the heat mass and the fins without having to resort to increases in the size of the heat mass, a surface area of the fins, the size of the fan, or the flow rate of the first air flow.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 11a through 11d are cross-sectional views depicting several embodiments of a disrupter orifice according to the present invention.

FIG. 11e is a cross-sectional view depicting a disrupter orifice including a nozzle according to the present invention.

FIG. 11f is a cross-sectional view of an injector face including grooves that are shaped to accommodate a top edge of a fin according to the present invention.

DETAILED DESCRIPTION

Figure 1:
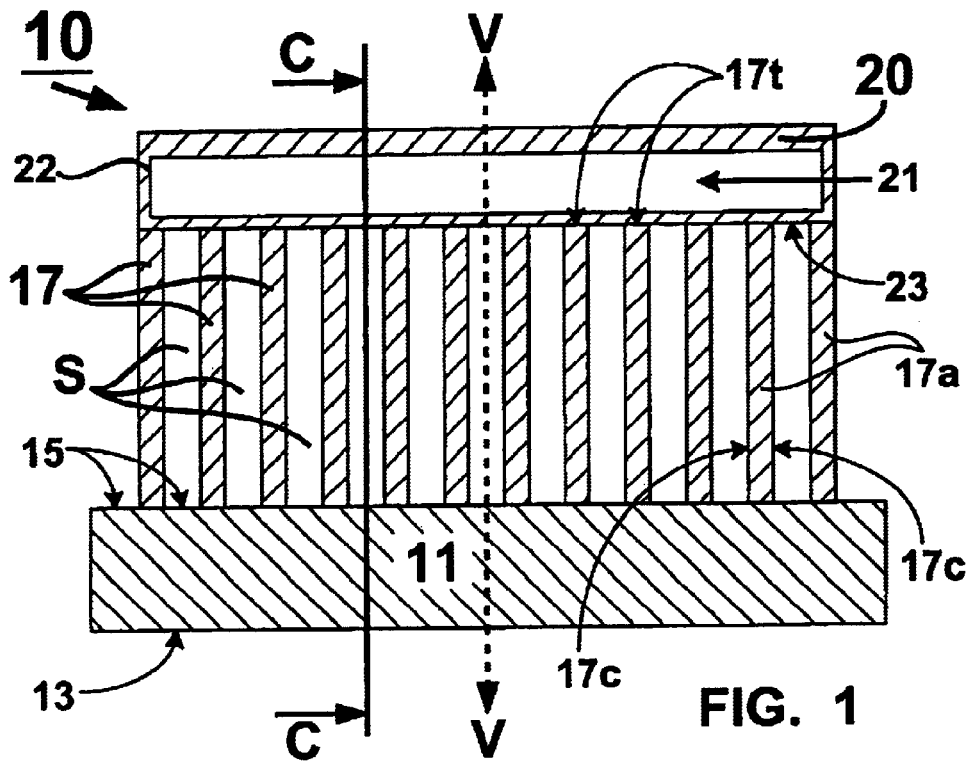
FIG. 1 is a front view of a cooling device with air shower according to the present invention.
Figure 2:
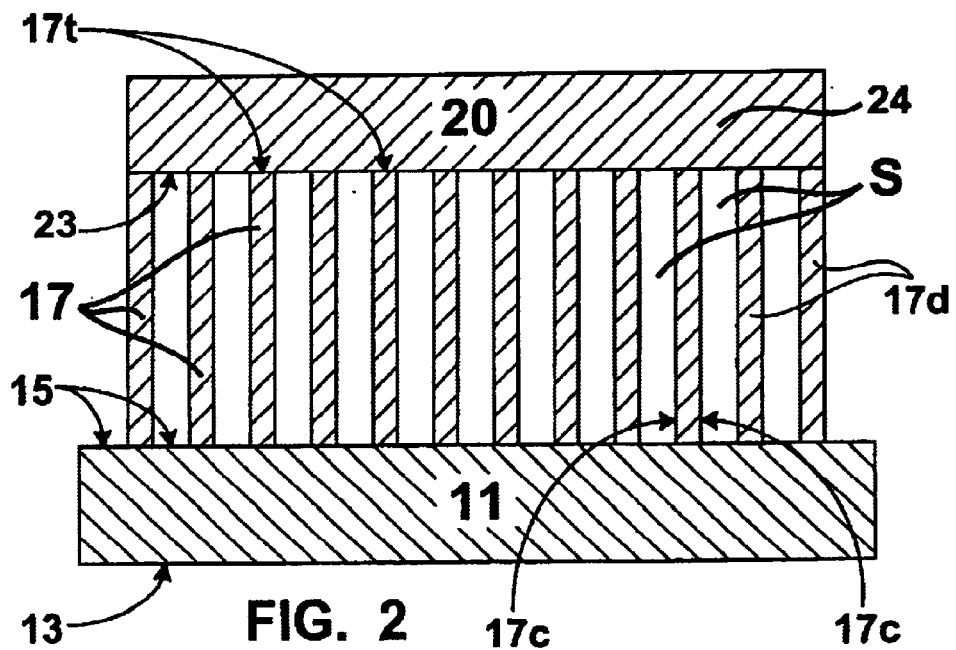
FIG. 2 is a rear view of a cooling device with air shower according to the present invention.
Figure 3:
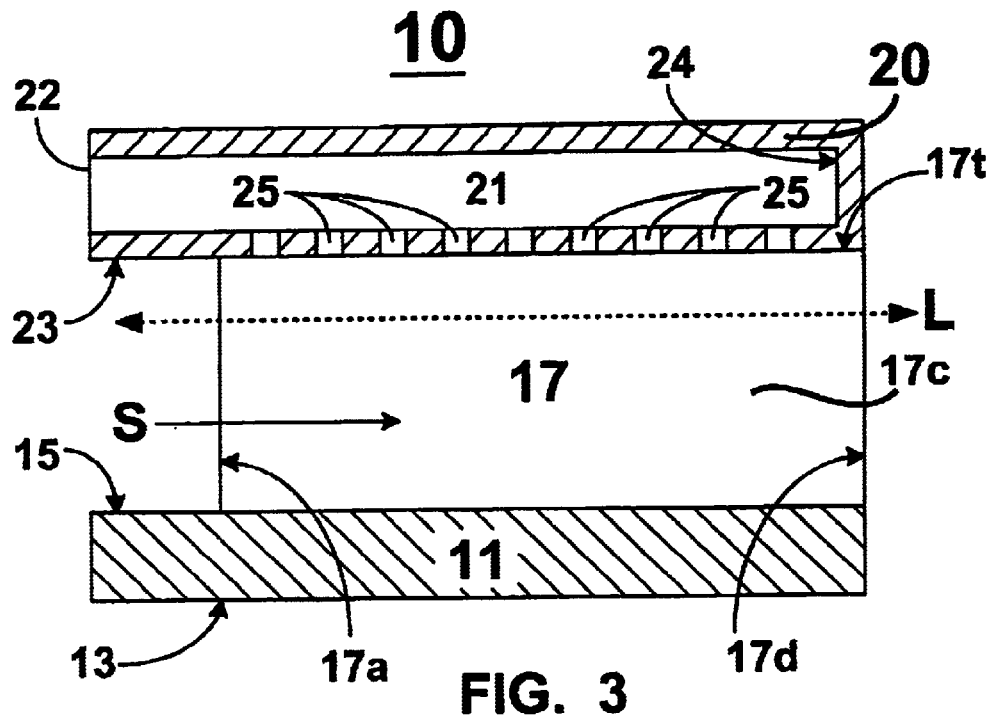
FIGS. 3 and 4 are cross-sectional views taken along line C—C of FIG. 1 and depict an air impingement chamber and disrupter orifices according to the present invention.

In the following detailed description and in the several figures of the drawings, like elements are identified with like reference numerals.

As shown in the drawings for purpose of illustration, the present invention is embodied in a cooling device for dissipating heat from a component. The cooling device includes a heat mass with a top surface and a mounting surface. The mounting surface is adapted to thermally connect the heat mass with a component to be cooled by the cooling device. A plurality of fins are connected with the top surface of the heat mass and the fins are substantially aligned with a vertical axis of the heat mass. Each fin includes opposed side surfaces, a top edge, a leading edge, and a trailing edge. The fins are spaced apart from one another to define a plurality of slots between adjacent fins and the slots are substantially aligned with a longitudinal axis of the heat mass.

The cooling device further includes an air shower that is positioned adjacent to the top edges of the fins. The air shower includes an air inlet that extends into the air shower to define an air impingement chamber that terminates at a closed end, an injector face, and a plurality of disrupter orifices that extend from the air impingement chamber to the injector face. The injector face is positioned adjacent to the top edges of the fins so that disrupter orifices are positioned over the slots. Essentially, the air shower is a hollow structure with one side open to receive an air flow into the air impingement chamber and the plurality of disrupter orifices of any geometric shape formed in the injector face.

A second air flow enters the air impingement chamber through the air inlet and exits the air impingement chamber through the disrupter orifices. The second air flow then enters the slots between the fins and impinges on a first air flow flowing through the slots. The second air flow induces turbulence in the first air flow and that turbulence is operative to disrupt a thermal boundary layer in the first air flow and results in an increase in a rate of heat transfer from the fins and the heat mass to the first air flow. Consequently, heat is more efficiently dissipated from the heat mass and the fins.

In prior cooling devices, wherein for a given cross-sectional area of the fins/vanes, increasing a height of the fins/vanes beyond certain limits does not improve the heat transfer rate from the fins/vanes to an air flow. Moreover, increasing a capacity of the fan to increase a flow rate in CFM through the fins/vanes of the prior cooling devices is also limited due to constraints on space and noise levels generated by a higher capacity fan.

Unlike prior cooling devices, one advantage of the cooling device of the present invention is that it improves the heat transfer rate from the fins and heat mass to the air flow without an increase in fin area, fin height, and fan capacity because the air shower injects the second air flow between the fins to breakup the thermal boundary layer thereby increasing heat transfer.

In FIGS. 1 through 4, a cooling device 10 for dissipating heat from a component includes a heat mass 11 including a top surface 15 and a mounting surface 13 that is adapted to thermally connect the heat mass 11 with the component (not shown). A plurality of fins 17 are connected with the top surface 15 of the heat mass 11 and the fins 17 are substantially aligned with a vertical axis V of the heat mass 11. Each fin 17 includes opposed side surfaces 17c, a top edge 17t, a leading edge 17a, and a trailing edge 17d. The fins 17 are spaced apart from one another to define a plurality of slots S between adjacent fins 17 and the slots S are substantially aligned with a longitudinal axis L of the heat mass 11.

The cooling device 10 further includes an air shower 20 including an air inlet 22 that extends into the air shower 20 to define an air impingement chamber 21, an injector face 23 and a plurality of disrupter orifices 25 that extend from the air impingement chamber 21 to the injector face 23. The injector face 23 is positioned adjacent to the top edges 17t of the fins 17 so that the disrupter orifices 25 are positioned over the slots S between adjacent fins 17. The air impingement chamber 21 extends only partially into the air shower 20 and the air impingement chamber 21 terminates at a closed end 24 of the air shower 20 (see FIGS. 2, 3, and 4). Because the air impingement chamber 21 has openings at the air inlet 22 and the disrupter orifices 25, an air flow entering the air impingement chamber 21 through the air inlet 22 exits the air impingement chamber 21 through the disrupter orifices 25.

Figure 10A:
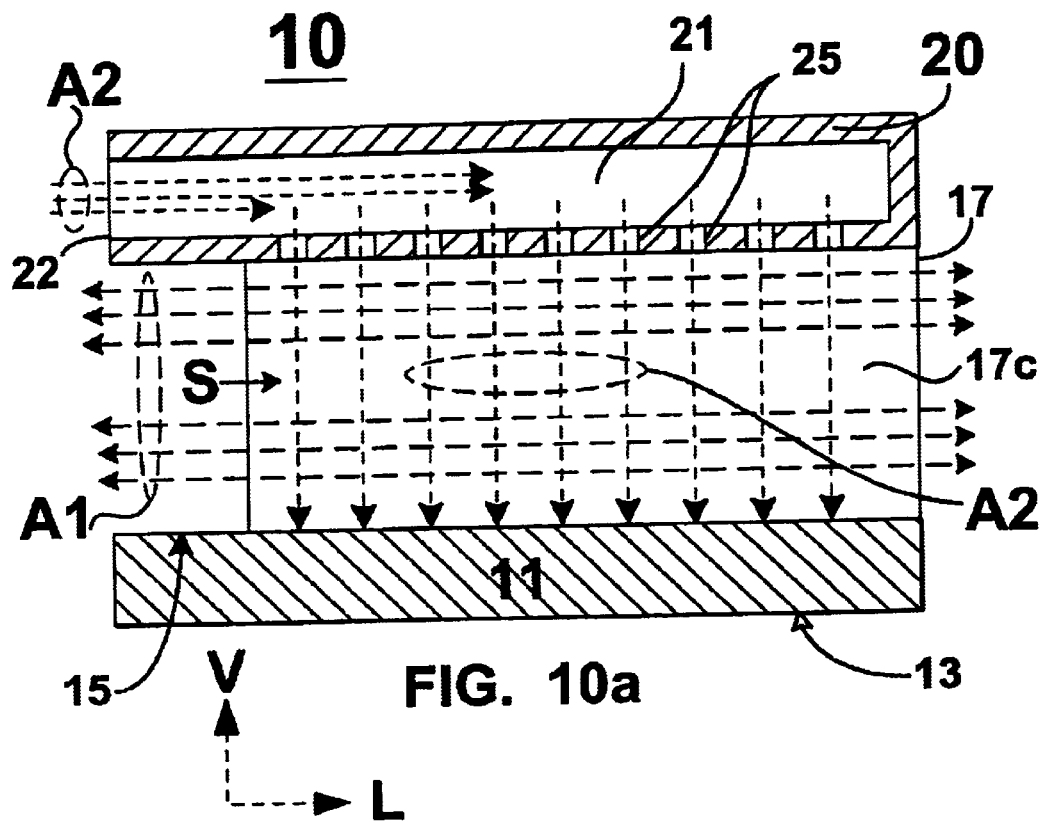
FIG. 10a is a cross-sectional view depicting a second air flow impinging on a first air flow according to the present invention.
Figure 10B:
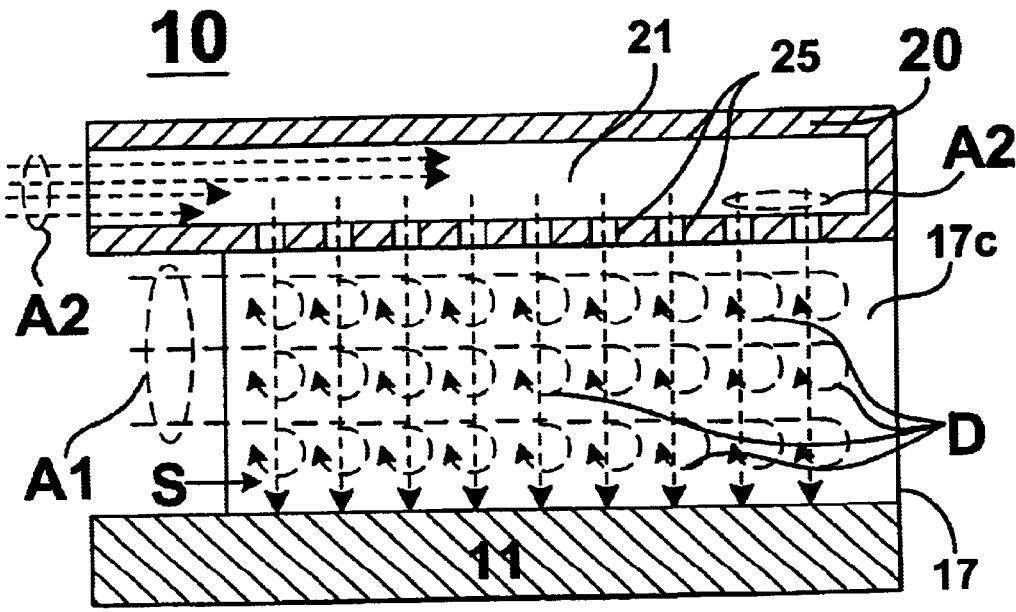
FIG. 10b is a cross-sectional view depicting a second air flow disrupting a first air flow and generating turbulence in the first air flow according to the present invention.

In FIGS. 10a and 10b, a first air flow A1 flows through the slots S between the fins 17. The first air flow A1 can be a positive air flow that enters the slots S at the leading edge 17a and exits the slots S at the trailing edges 17d or the first air flow A1 can be a negative air flow that enters the slots S at the trailing edges 17d and exits the slots S at the leading edges 17a. For purposes of illustration, in FIGS. 10a and 10b, the first air flow A1 is depicted as flowing from the leading edge 17a to the trailing edge 17d (i.e. a positive air flow).

A second air flow A2 enters the air impingement chamber 21 through the air inlet 22 and exits the air impingement chamber 21 through the disrupter orifices 25. The second air flow A2 enters the slots S and impinges on the first air flow A1 (see FIG. 10a) and induces a turbulence D in the first air flow A1 (i.e. the second air flow A2 disrupts the first air flow A1, see FIG. 10b). The turbulence D is operative to disrupt a thermal boundary layer in the first air flow A1 and increases a rate of heat transfer from the fins 17 and the heat mass 11 to the first air flow A1. As a result of the increased rate of heat transfer, heat is more efficiently removed from the heat mass 11 and the fins 17 with a concomitant increase in efficiency of waste heat removal from the component to be cooled by the cooling device 10.

Figure 7A:
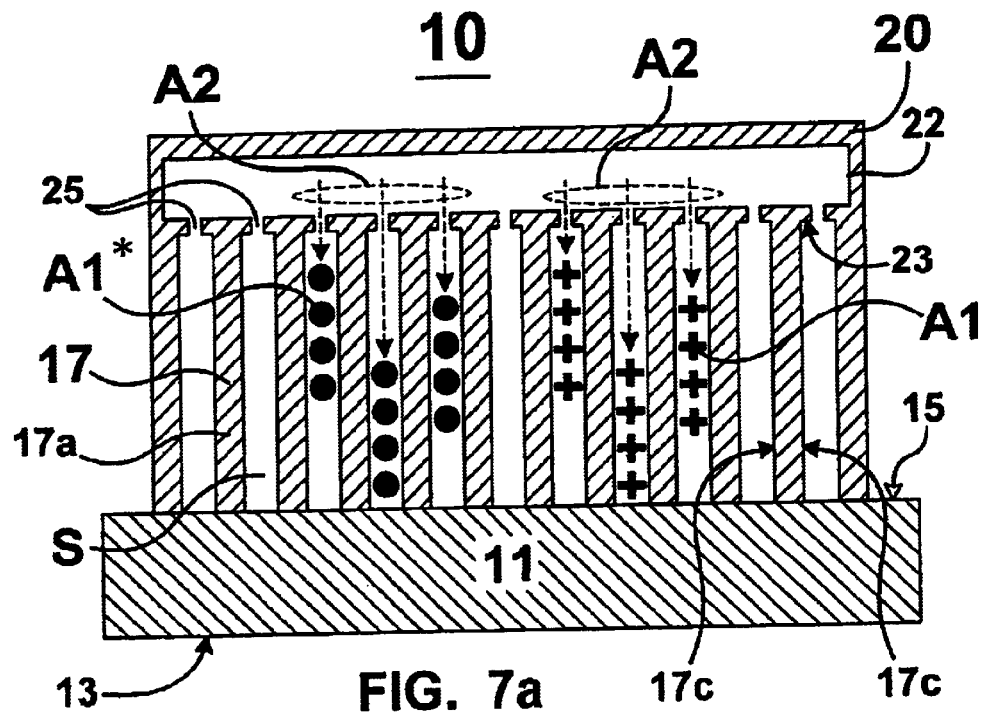
FIG. 7a is a cross-sectional view taken along line N—N of FIGS. 5b and 6b and depicts a second air flow from an air impingement chamber impinging on a first air flow according to the present invention.

In FIG. 7a, the interaction between the first and second air flows (A1, A1*, A2) is depicted schematically in a cross-sectional view looking into the leading edges 17a of the fins 17. The second air flow A2 exits the air impingement chamber 21 through the disrupter orifices 25 and enters into the slots S where the second air flow A2 impinges on and disrupts the first air flow A1 or A1*. The first air flow A1 is denoted as a "+" because it is flowing into the drawing sheet (i.e from the leading edge 17a to the trailing edge 17d) as in the case of a positive air flow. Conversely, the first air flow A1* is denoted as a "●" because it is flowing out of the drawing sheet (i.e from the trailing edge 17d to the leading edge 17a) as in the case of a negative air flow. In either case, the second air flow A2 induces turbulence D in the first air flow (A1, A1*) and that turbulence D disrupts the thermal boundary layer.

Figure 7B:
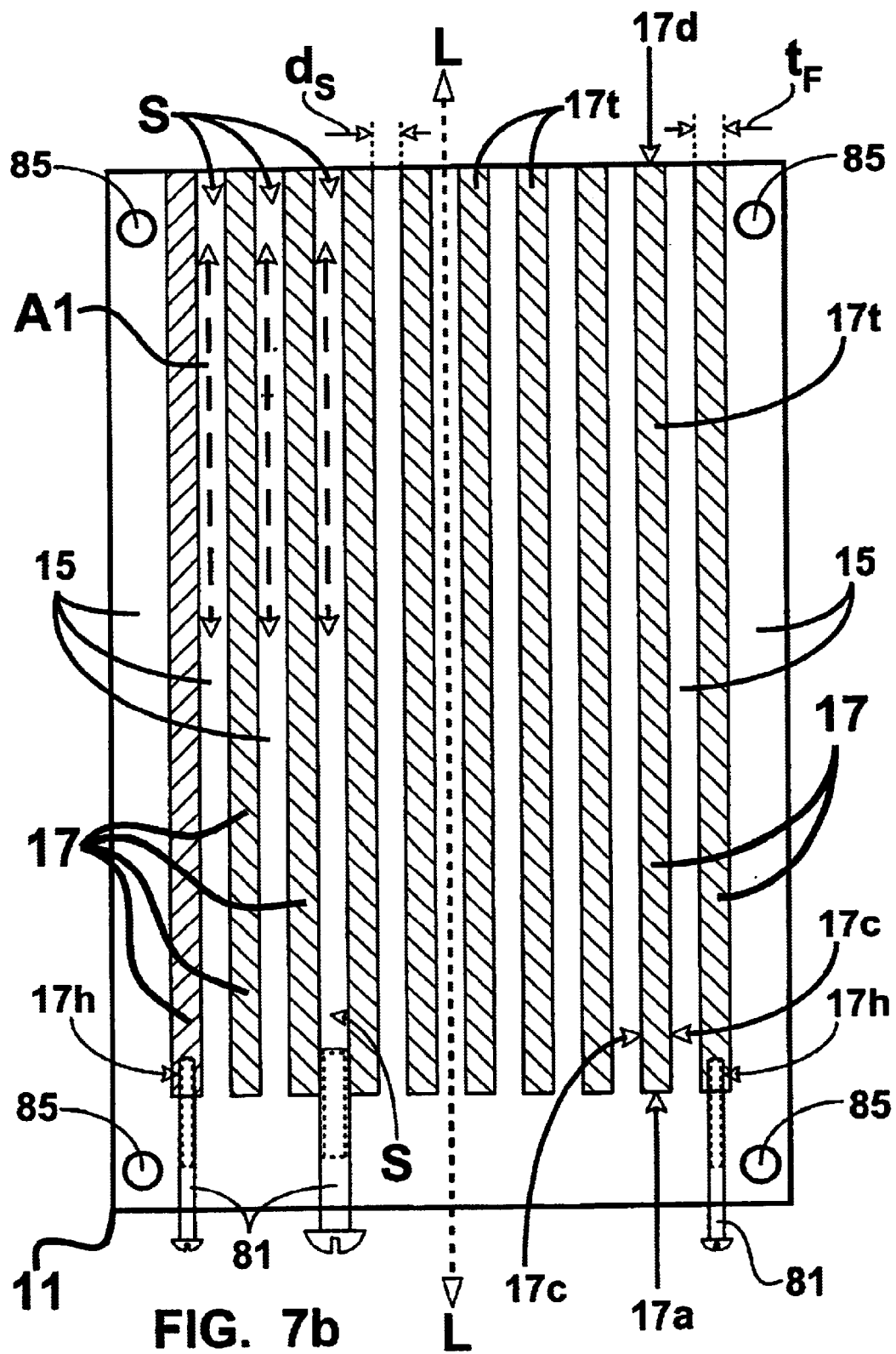
FIG. 7b is a top plan view of a plurality of fins and slots of a cooling device according to the present invention.

In FIG. 7b, the air shower 20 is not illustrated in order to show a more detailed view of the fins 17, the slots S, and the heat mass 11. As the first air flow A1 flows through the slots S it passes over the opposed side surfaces 17c of the fins 17, the top surface 15 of the heat mass 11, and either the leading edges 17a or trailing edges 17d of the fins 17 depending on the direction of the first air flow A1. The majority of the heat transferred from the fins 17 and the heat mass 11 to the first air flow A1 is contributed by a surface area of the opposed side surfaces 17c and the top surface 15 of the heat mass 11 because those surfaces comprise a major portion of the surface area of the cooling device 10 that is exposed to the first air flow A1.

The fins 17 have thickness $t_F$ and the slots S are spaced apart by a distance $d_S$. The thickness $t_F$ and the distance $d_S$ is are application dependent and may vary depending on parameters such as an air flow rate (CFM) of the first air flow A1 and the second airflow A2, a desired mass for the cooling device 10, and a desired level of air flow noise generated by the air flows (A1, A2), for example.

Figure 18A:
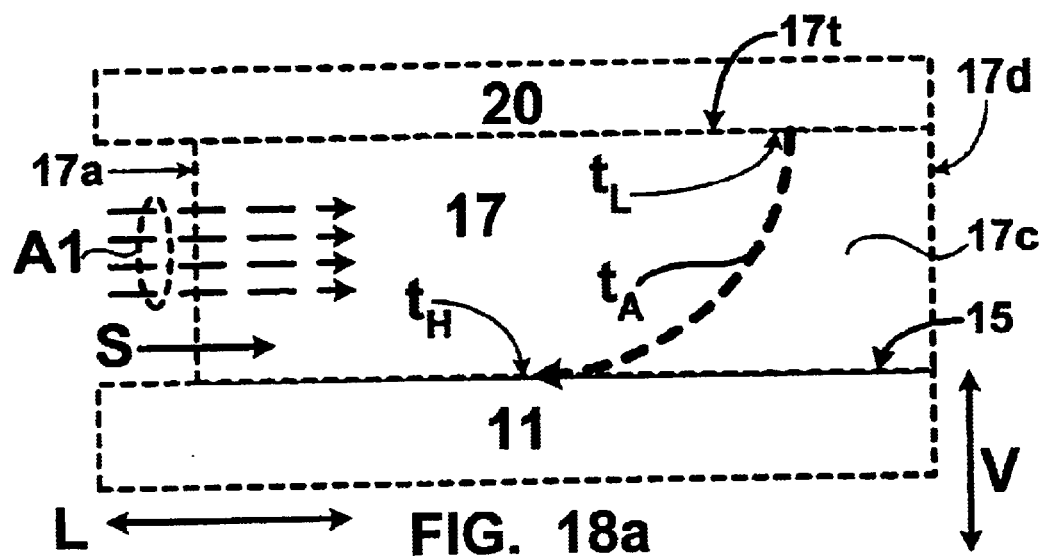
FIG. 18a is a schematic view depicting a temperature gradient along a vertical axis of a cooling device according to the present invention.

In FIG. 18a, because the mounting surface 13 of the heat mass 11 is in thermal communication with the component to be cooled (not shown), the heat mass 11 is at a higher temperature denoted as $t_H$. As the first air flow A1 enters into and flows through the slots S (i.e. from the leading edges 17a to the trailing edges 17d, or vice-versa), an air temperature $t_A$ of the first airflow A1 decreases in a direction along the vertical axis V from the top surface 15 of the heat mass 11 to the top edges 17t of the fins 17. Consequently, the air temperature $t_A$ decreases from the high temperature $t_H$ at the top surface 15 to a lower temperature $t_L$ at the top edges 17t. Accordingly, a temperature gradient exists along a vertical plane in the slots as denoted by the dashed line for $t_A$.

Figure 18B:
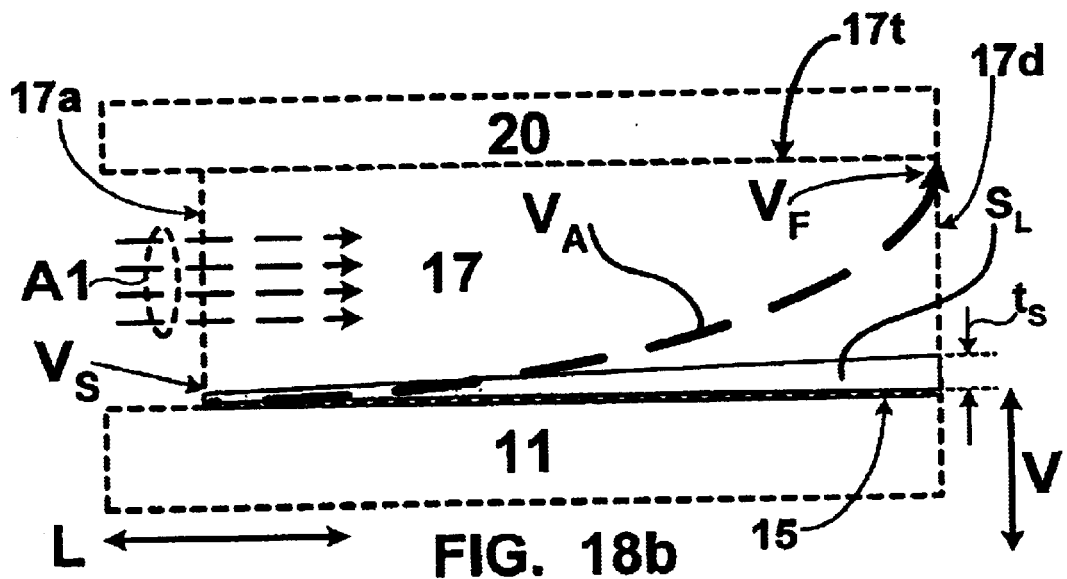
FIG. 18b is a schematic view depicting an air flow velocity gradient along a longitudinal axis and a stagnation layer along a vertical axis of a cooling device according to the present invention.

In FIG. 18b, the first air flow A1 enters the slots S with an approach velocity $V_A$. In a direction along the longitudinal axis L (i.e. from the leading edges 17a to the trailing edges 17d, or vice-versa), the approach velocity $V_A$ increases from a slower velocity $V_S$ at the top surface 15 of the heat mass 11 to a faster velocity $V_F$ at the top edges 17t of the fins 17. Resulting is a velocity gradient along a vertical plane as denoted by the dashed line for $V_A$. As the first air flow A1 passes through the slots S, a thin layer of stagnant air $S_L$ forms along the top surface 15 and a thickness $t_s$ of that layer of stagnant air $S_L$ increases in a direction along the longitudinal axis L such that the layer of stagnant air $S_L$ is slightly thicker at the trailing edges 17d than it is at the leading edges 17a. Conversely, if the first air flow A1 enters the slots S at the trailing edges 17d, then the layer of stagnant air $S_L$ is thicker at the leading edges 17a than it is at the trailing edges 17d.

As a result of the combined effects of the thermal gradient in the air temperature $t_A$ of the first airflow A1 and the velocity gradient in the approach velocity $V_A$ of the first air flow A1, a thermal boundary layer develops in the slots S above the layer of stagnant air $S_L$. Because the thickness $t_s$ of the layer of stagnant air $S_L$ is on the order of microns ($\mu$m) above the top surface 15, the thermal boundary layer occupies a majority of a volume between the fins 17, that is the space between the top surface 15 and the top edges 17t of the fins 17 in the slots S.

The second air flow A2 flowing through the disrupter orifices 25 of the air impingement chamber 21 disrupts the thermal boundary layer and increases turbulence in the first air flow A1 as the first air flow A1 flows through the slots S. The aforementioned layer of stagnant air $S_L$ at the top surface 15 is substantially eliminated by the turbulence. The disruption of the thermal boundary layer increases a rate of heat transfer from the fins 17 and the heat mass 11 to the first air flow A1 so that the first air flow A1 efficiently removes waste heat from those portions of the fins 17 and the heat mass 11 that are exposed to the first air flow A1.

Preferably, the second air flow A2 disrupts the first air flow (A1, A1*) along an entire vertical length of the slots S (that is, a space from the injector face 23 to the top surface 15 of the heat mass 11 along the vertical axis V) so that the turbulence D is induced along the entire vertical length of the slots S.

Figure 18C:
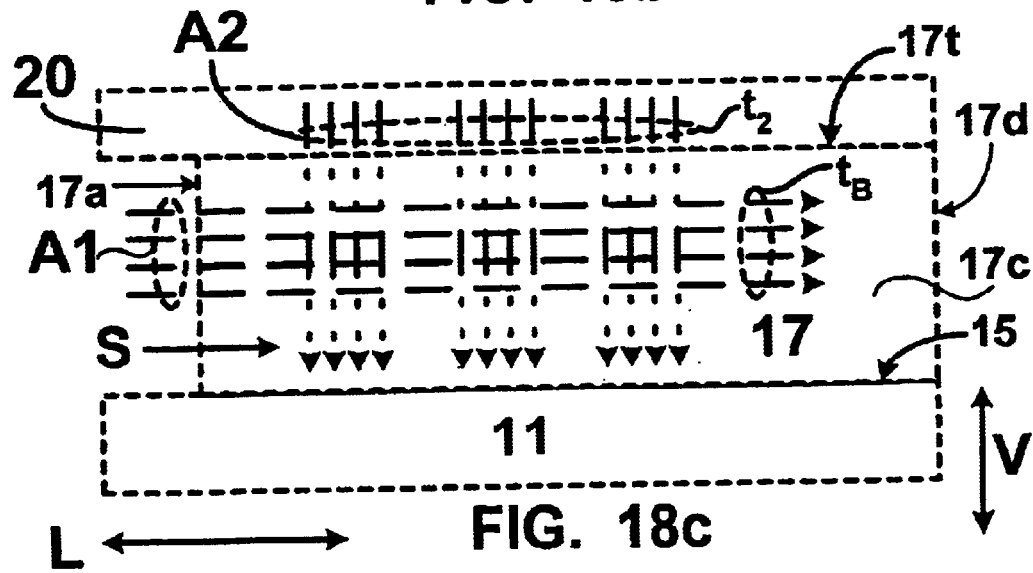
FIG. 18c is a schematic view depicting an effect of a second air flow on a bulk fluid temperature of a first air flow according to the present invention.

In FIG. 18c, heat transfer from the fins 17 and the heat mass 11 is further increased when the second air flow A2 has a lower temperature $t_2$ than the first air flow A1 which has a bulk fluid temperature $t_B$ (that is, $t_2 < t_B$). The second air flow A2 impinges on the first air flow A1 and the lower temperature $t_2$ reduces the bulk fluid temperature $t_B$ of the first air flow A1. The reduction in the bulk fluid temperature $t_B$ increases a caloric heat transfer rate from the fins 17 and the heat mass 11 to the first air flow A1.

In FIGS. 5a through 6b, the fins 17 need not span the entire length of the air shower 20. For example, in FIG. 5a, the leading edges 17a of the fins 17 are inset from the air inlet 22. Although not shown, the trailing edges 17d can also be inset from the closed end 24 of the air shower 20 in a manner similar to that of the leading edges 17a. In contrast, in FIG. 6a, the leading and trailing edges (17a, 17d) are substantially flush with the air inlet 22 and the closed end 24 such that the fins 17 span substantially the entire length of the air shower 20.

Figure 9:
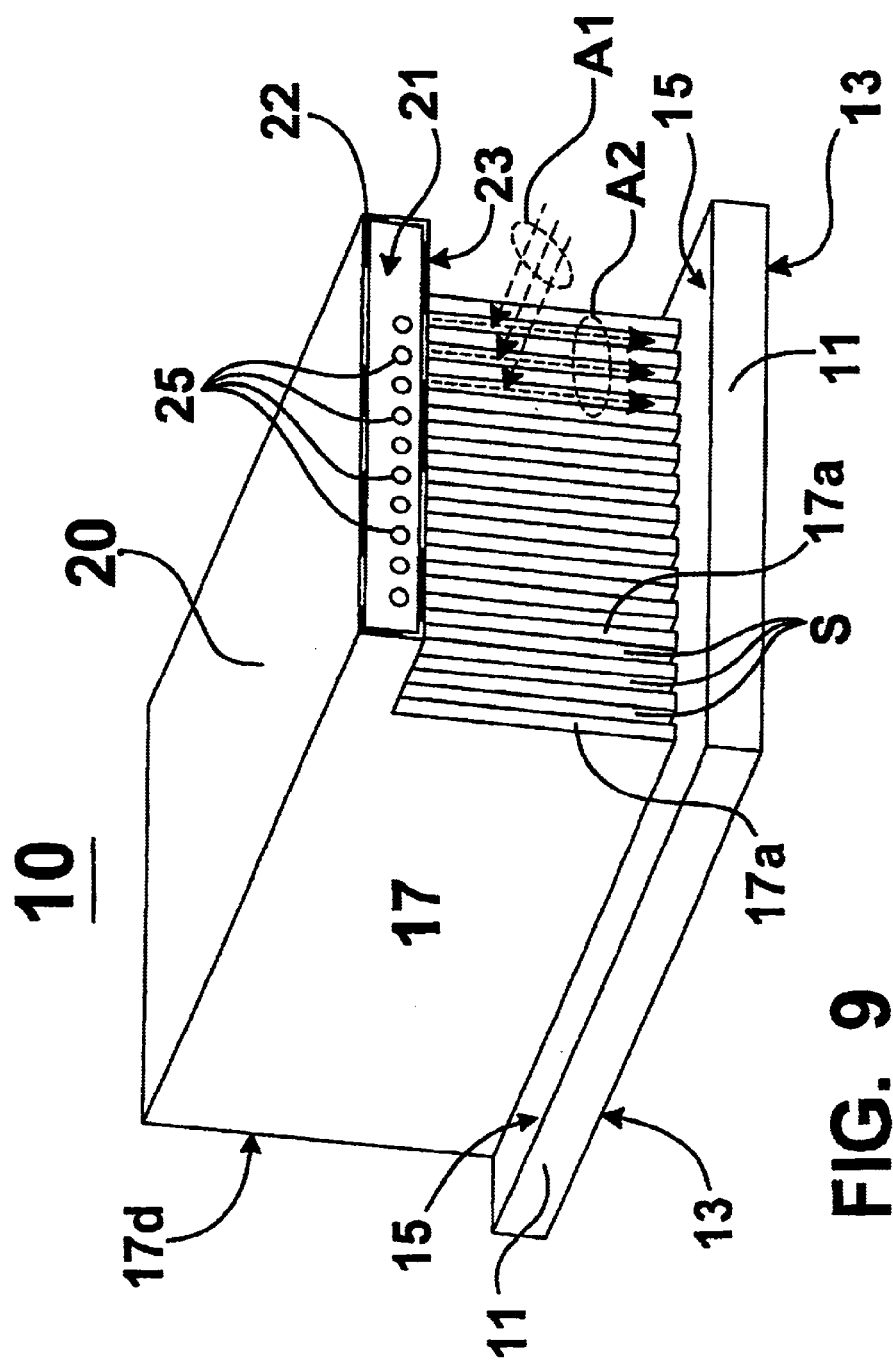
FIG. 9 is a profile view of a cooling device with air shower according to the present invention.
Figure 19:
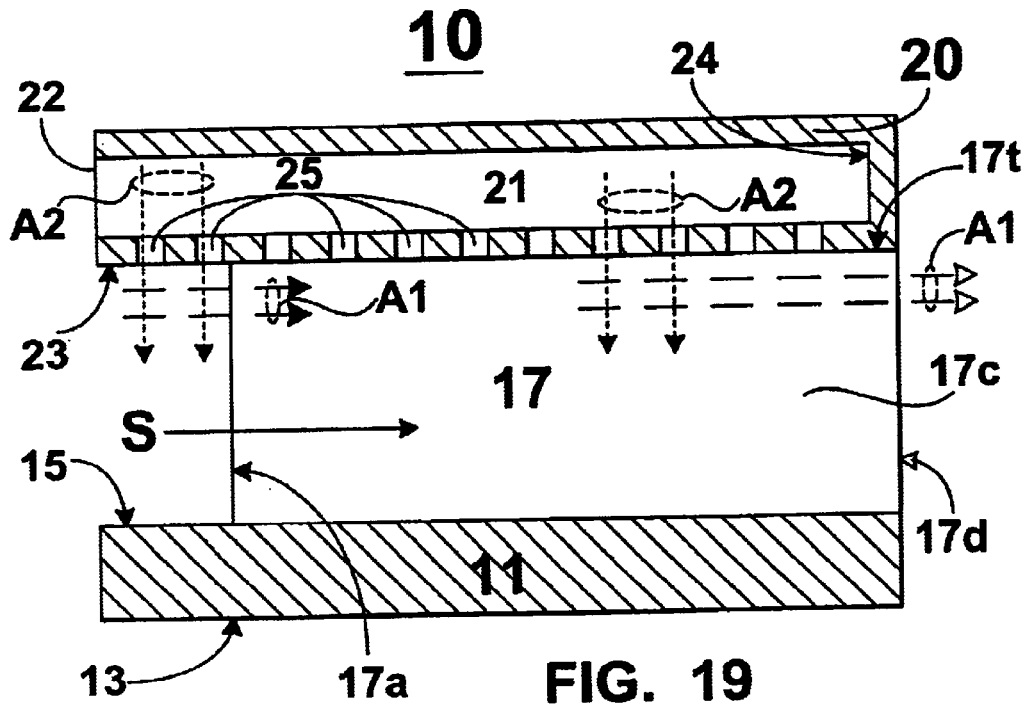
FIG. 19 is a cross-sectional view depicting pre-turbulence generated by disrupter orifices positioned outward of a leading edge of a fin according to the present invention.

In FIGS. 9 and 19, the leading edges 17a are inset from the air inlet 22 and the disrupter orifices 25 are positioned along the air impingement chamber 21 so that a portion of the disrupter orifices 25 are disposed outward of the leading edges 17a. As a result, the second air flow A2 flowing through those disrupter orifices 25 can disrupt the first air flow A1 and induce a pre-turbulence in the first air flow A1 before the first air flow A1 enters the slots S at the leading edges 17a (see FIG. 19). Consequently, the turbulence in the slots S generated by the second air flow A2 into the slots S is enhanced by the pre-turbulence in the first air flow A1. The generation of pre-turbulence can be useful, particularly when the first air flow A1 is a laminar flow prior to entering the slots S at the leading edges 17a. For instance, if the first air flow A1 passes through a duct or conduit before entering the leading edges 17a, the duct or conduit may create a laminar flow in the first air flow A1.

Figure 20:
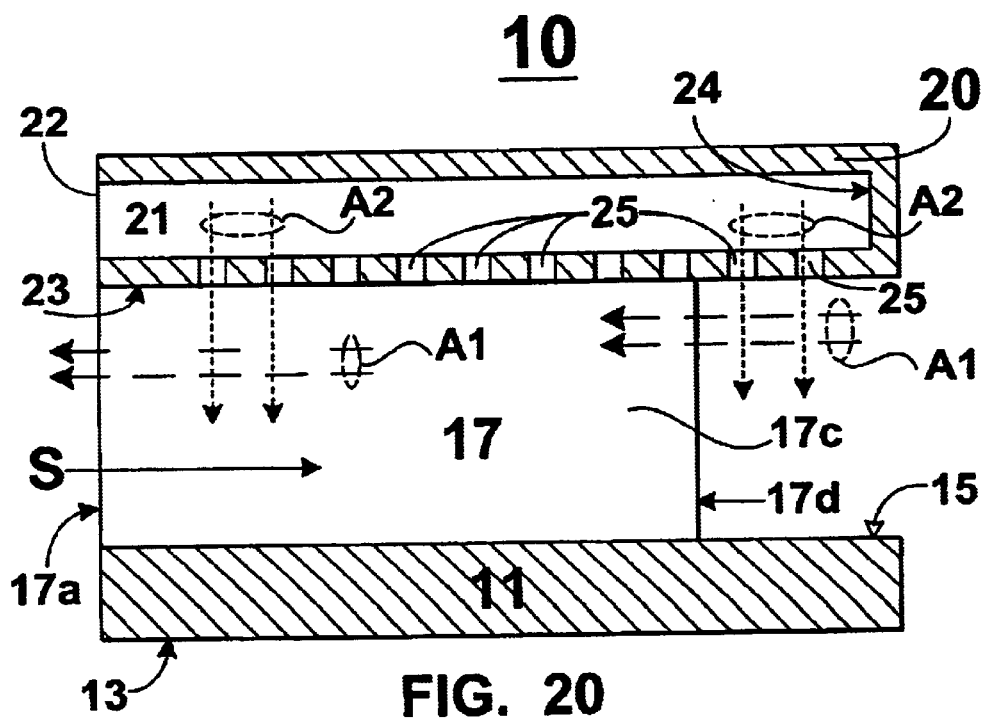
FIG. 20 is a cross-sectional view depicting pre-turbulence generated by disrupter orifices positioned outward of a trailing edge of a fin according to the present invention.

Similarly, in FIG. 20, if the trailing edges 17d are inset from the closed end 24, then disrupter orifices 25 disposed outward of the trailing edges 17d can be used to generate pre-turbulence in the same manner as described above with the only difference being the first air flow A1 is moving in a direction from the trailing edges 17d to the leading edges 17a.

Figure 4:
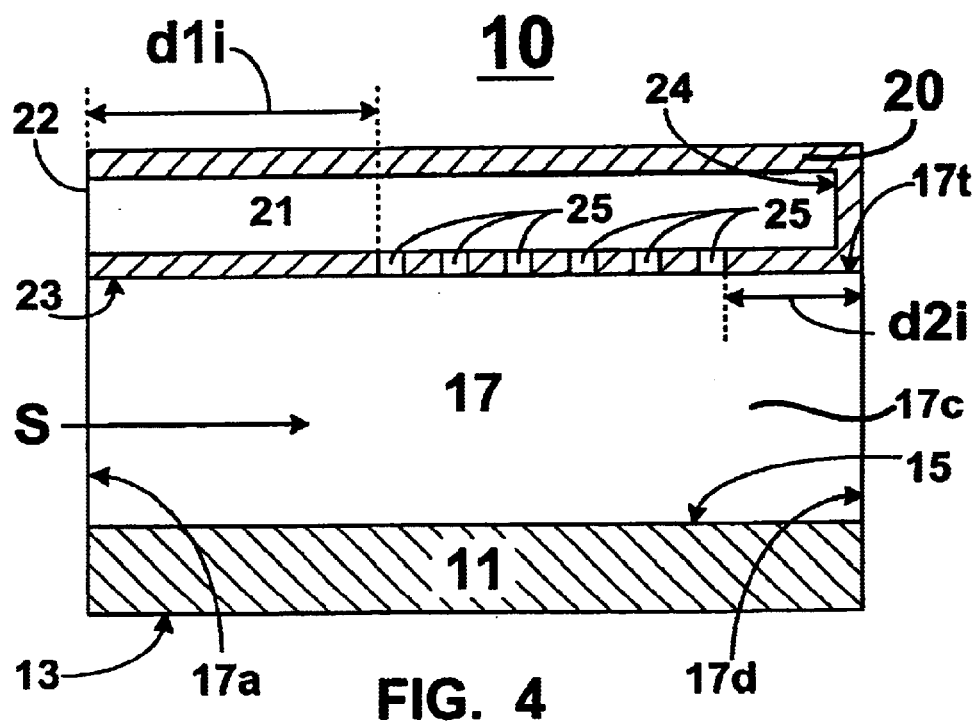
Figure 5A:
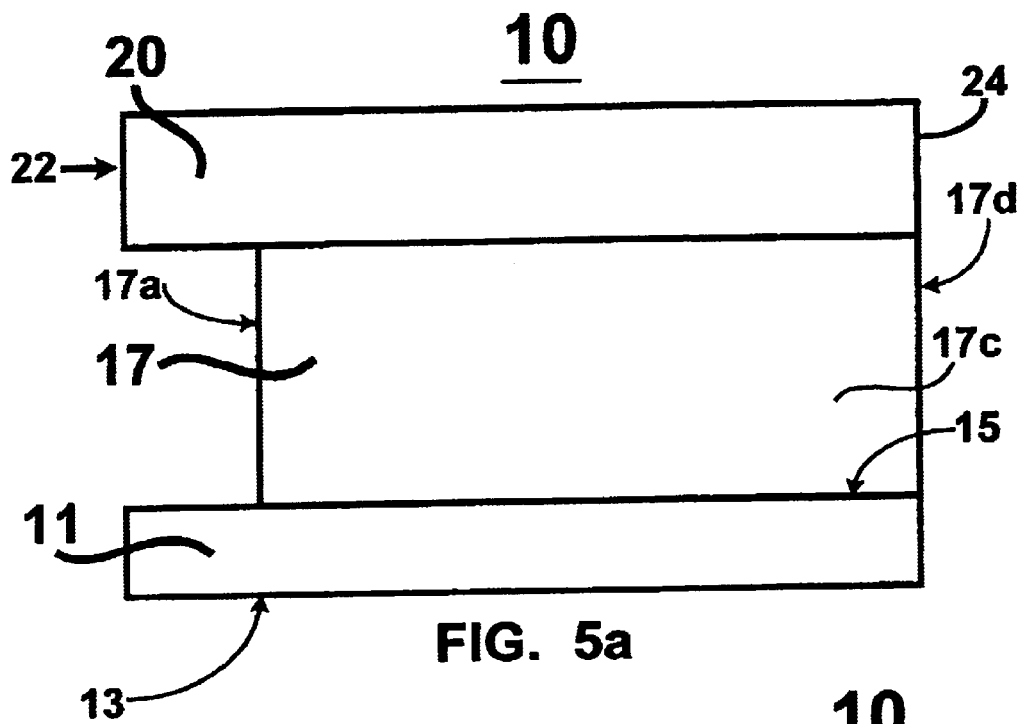
FIGS. 5a and 5b are a right side view and a top plan view respectively of an embodiment of a cooling device with air shower according to the present invention.
Figure 5B:
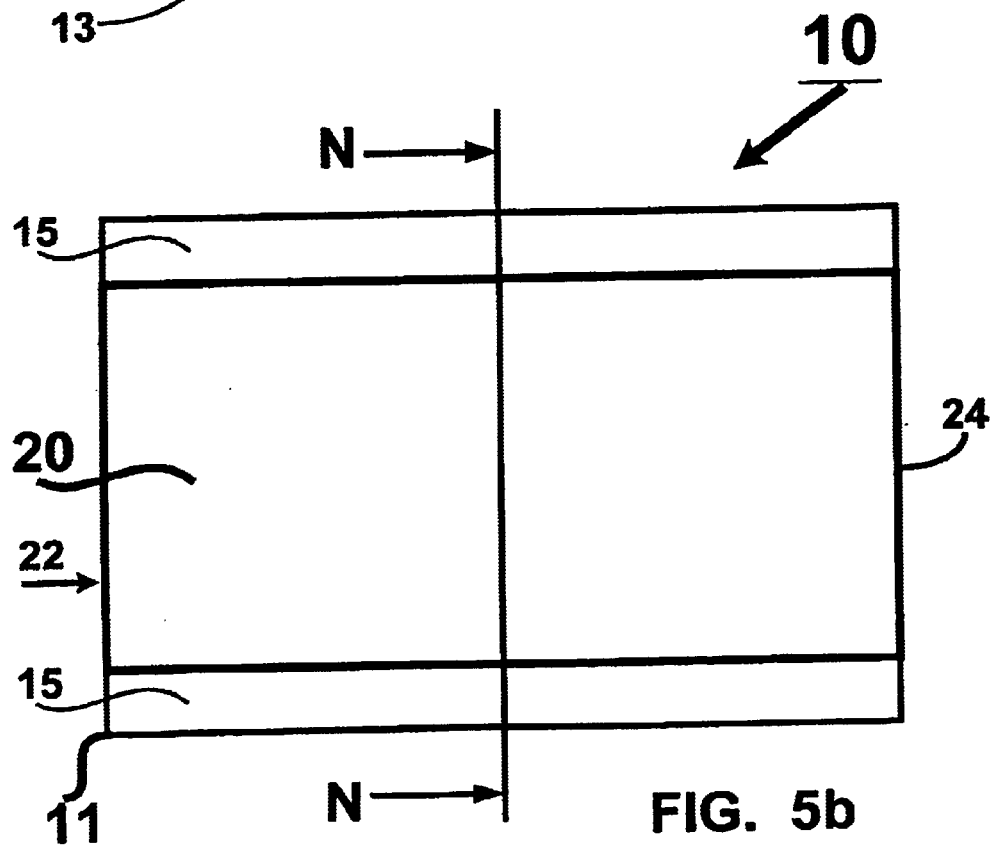
Figure 6A:
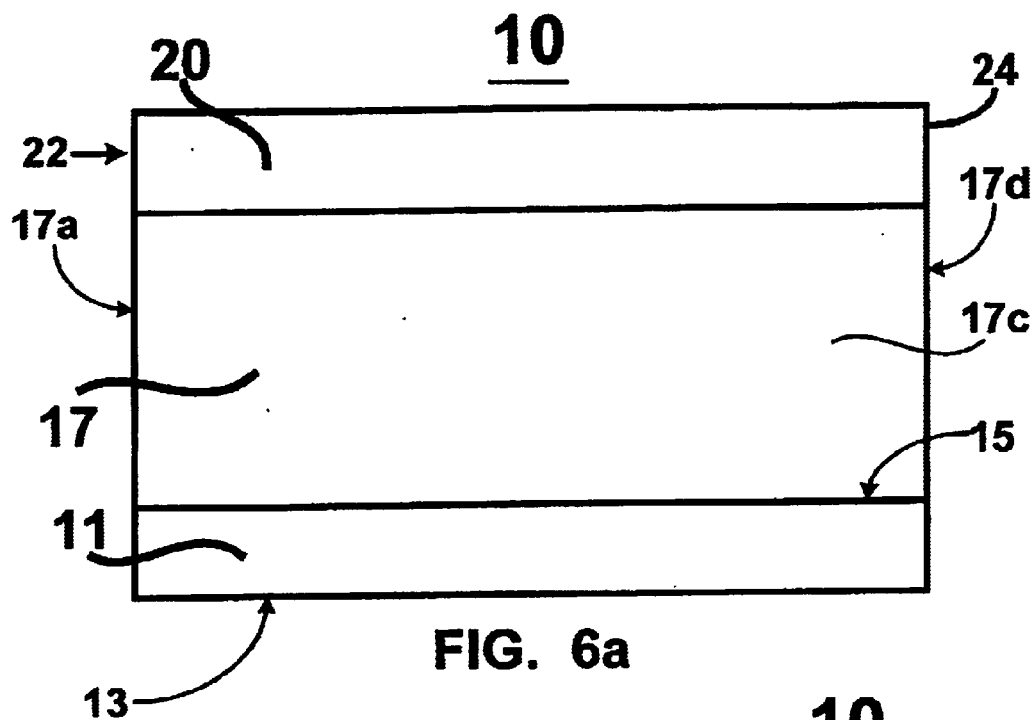
FIGS. 6a and 6b are a right side view and a top plan view respectively of another embodiment of a cooling device with air shower according to the present invention.
Figure 6B:
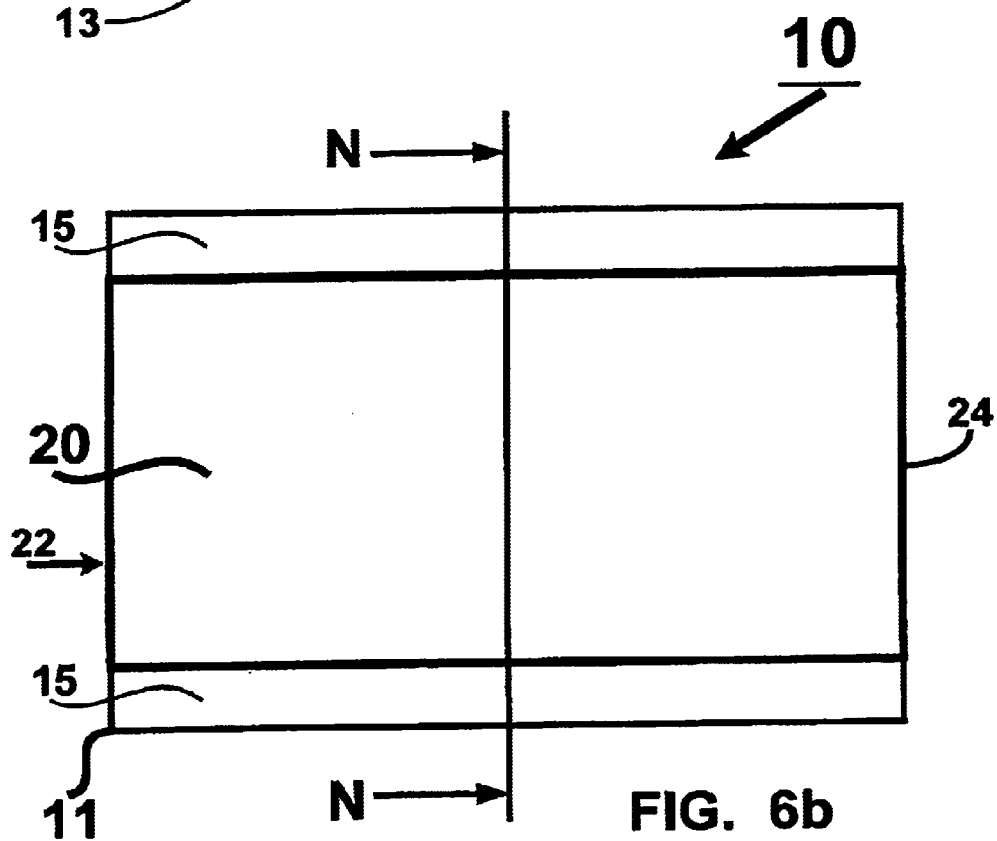

In FIG. 4, the disrupter orifices 25 of the air impingement chamber 21 can be inset from either one or both of the air inlet 22 or the closed end 24 of the air shower 20. For example, the disrupter orifices 25 can be inset from the air inlet 22 by an inset distance d1i such that a portion of the injector face 23 proximate the air inlet 22 is not populated with the disrupter orifices 25. On advantage to positioning the disrupter orifices 25 at the inset distance d1i is that disruption of the first air flow A1 occurs at a further distance inward of the leading edges 17a of the fins 17. Therefore, the disruptive effect of the second air flow A2 on the first air flow A1 can be modified by changes in the inset distance d1i.

Moreover, the number of disrupter orifices 25 can be increased or decreased by increasing or decreasing the inset distance d1i. Depending on an air pressure in the air impingement chamber 21, deceasing the number of disrupter orifices 25 can result in a higher flow rate of the second air flow A2 into the slots S. Conversely, increasing the number of disrupter orifices 25 can result in a lower flow rate of the second air flow A2 into the slots S.

In contrast, the disrupter orifices 25 can be inset from the closed end 24 of the air shower 20. For example, the disrupter orifices 25 can be inset from the close end 24 by an inset distance d2i such that a portion of the injector face 23 proximate the closed end 24 is not populated with the disrupter orifices 25. As described above, the inset distance d2i can be used to modify the disruptive effect of the second air flow A2 on the first air flow A1.

The spacing between adjacent disrupter orifices 25 need not be an equidistant spacing. Preferably, the disrupter orifices 25 are spaced closer together (i.e. more densely packed) towards the trailing edges 17d of the fins 17 because the thermal boundary layer builds up in a direction away from the leading edges 17a (see FIG. 18b for a positive air flow from the leading edges 17a to the trailing edges 17d).

Conversely, for a negative air flow from the trailing edges 17d to the leading edges 17a, it is preferable for the the disrupter orifices 25 to be spaced closer together (i.e. more densely packed) towards the leading edges 17a of the fins 17 because the thermal boundary layer will build up in a direction away from the trailing edges 17d.

Figure 8:
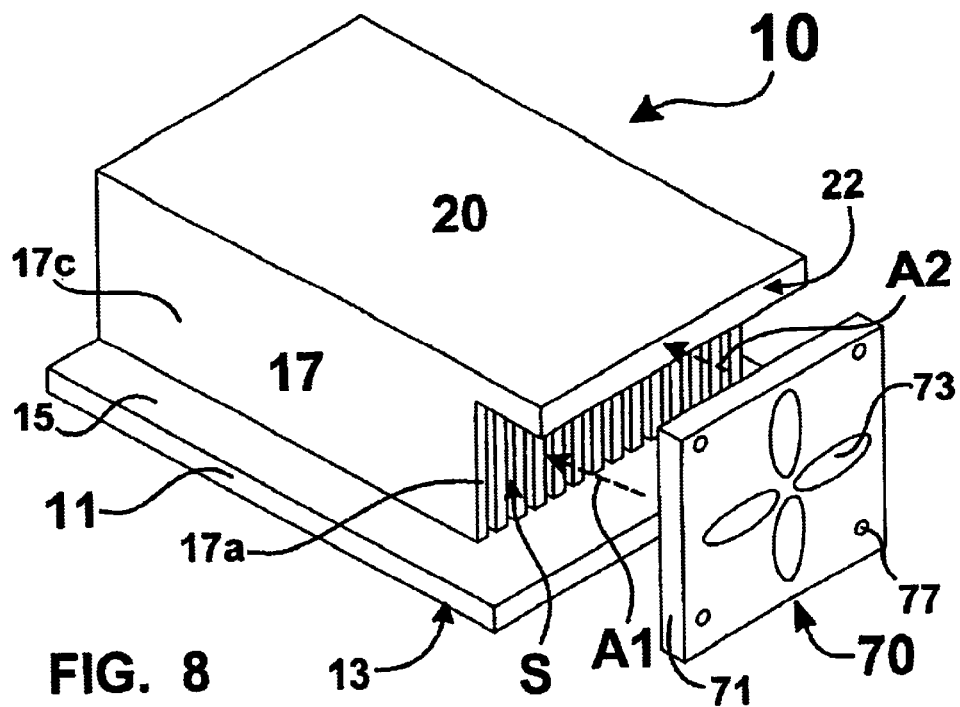
FIG. 8 is a profile view depicting a common air flow source for generating a first air flow and a second air flow according to the present invention.

In FIG. 8, the first and second air flows (A1, A2) are generated by a common air flow source 70. The common air flow source 70 is positioned so that a portion of an air flow (not shown) generated by the common air flow source 70 enters the slots S as the first air flow A1 and another portion of the air flow enters the air inlet 22 as the second air flow A2.

Figure 16A:
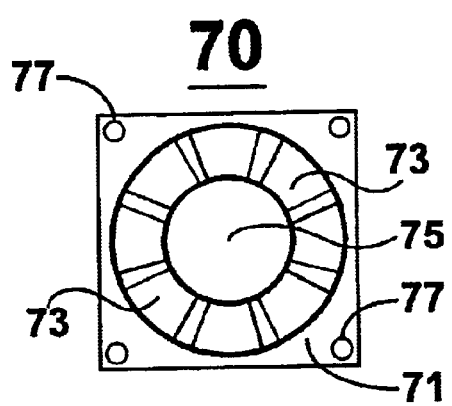
FIG. 16a depicts one example an air flow sources according to the present invention.
Figure 16B:
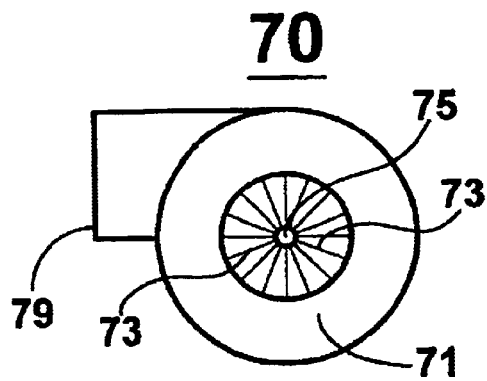
FIGS. 16b and 16c depict another example of an air flow sources according to the present invention.

In FIGS. 16a and 16b, an air flow source 70 (including the common air flow source 70) can be an electric fan (see FIG. 16a) or an electric blower (see FIG. 16b) such as the type commonly used to cool electronic devices such as a personal computers (PC), a server, or a workstation, for example. The air flow source 70 can include a housing 71 that surrounds a plurality of fan blades 73 connected with a hub 75. A plurality of mounting holes 77 in the housing 71 can be used to mount the air flow source 70 with the cooling device 10.

Figure 13A:
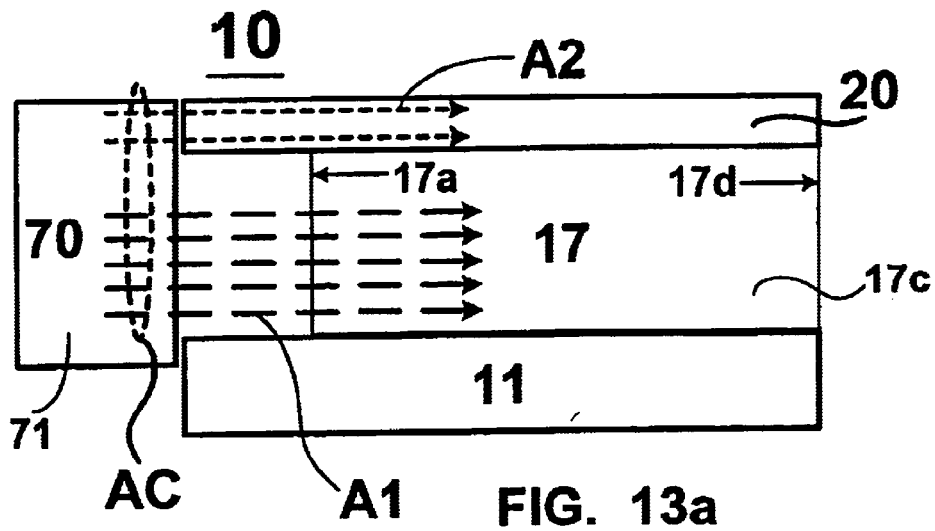
FIG. 13a is a cross-sectional view depicting a common air flow source for generating a first air flow and a second air flow according to the present invention.

The common air flow source 70 (as depicted in FIGS. 8 and 13a) can be connected with the cooling device 10 or it can be positioned relative to the cooling device 10 so that a common air flow AC generated by the common air flow source 70 enters the slots S (as the first air flow A1) and the air inlet 22 (as the second air flow A2). A fastener or the like can be used to connect the common air flow source 70 with the cooling device 10.

In FIG. 7b, a fastener 81, such as a threaded screw, can be inserted through the mounting holes 77 (see FIG. 8) and the threads can either engage the opposed side surfaces 17c that define the slots S. Alternatively, the leading or trailing edges (17a, 17d) of the fins 17 can include a hole 17h for receiving the threaded portion of the fastener 81. The hole 17h can have a smooth bore or the hole 17h can be machined to include threads that complement the threads on the fastener 81.

The above mounting techniques are only examples, and the common air flow source 70 can be connected with the cooling device 10 using a variety of fastening techniques including bu not limited to clips, springs, adhesives, glue, adhesive tape, a nut and bolt, rivets, and velcro just to name a few.

In FIGS. 8 and 13a, the common air flow source 70 is an integral fan because the common air flow source 70 is a fan dedicated to supplying the common air flow AC that forms the first and second air flows (A1, A2). However, in FIG. 17, a system fan 80 can supply a system air flow $A_S$ and supply an air flow $A_F$ for cooling the cooling device 10 of the present invention. The system air flow $A_S$ is operative to cool components in a system (not shown) that carries the system fan 80; whereas, the air flow $A_F$ is operative to cool the component 50 that is in thermal communication with the cooling device 10. Accordingly, the first and second air flows (A1, A2) are derived from the air flow $A_F$.

A duct 90 including a first branch 92 for channeling the system air flow $A_S$ to the system and a second branch 94 for channeling the air flow $A_F$ to the cooling device 10, can be connected with the system fan 80. For instance, an input end 96 of the duct 90 can be connected with an output end 79 of the system fan 80 and an air flow from the system fan 80 exits the output end 79, enters the duct 90 at the input end 96, and branches off into the system air flow $A_S$ and the air flow $A_F$.

Figure 14:
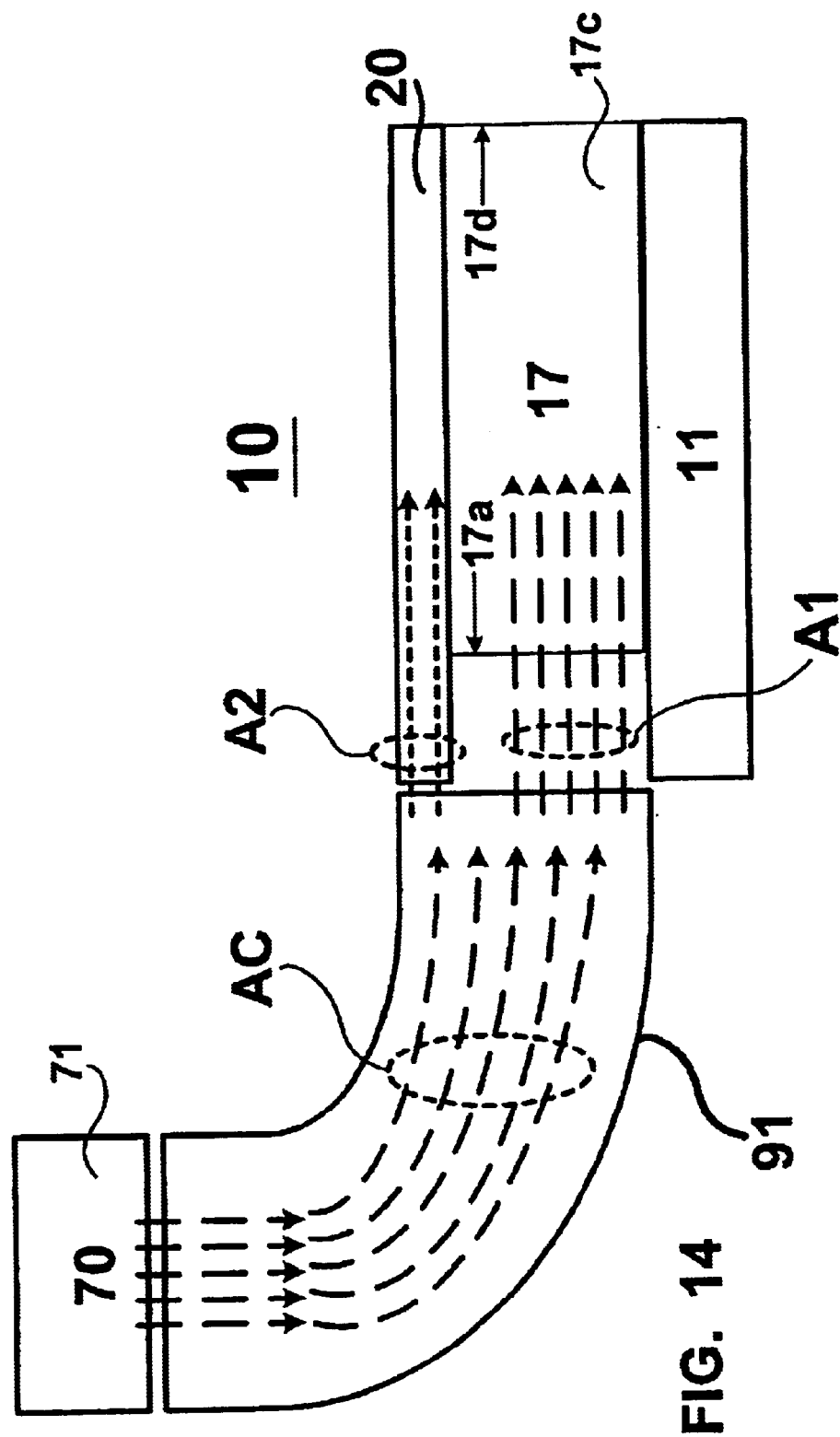
FIG. 14 is a cross-sectional view depicting a first conduit for communicating an air flow from an air flow source according to the present invention.

In FIG. 14, a common conduit 91 can be used to communicate (i.e. channel) the common air flow AC from the common air flow source 70 to the cooling device 10. As was described above, the first and second air flows (A1, A2) are derived from the common air flow AC. The common conduit 91 can be a duct for example. The common conduit 91 can be connected with the cooling device 10 or it can be positioned relative to the cooling device 10 so that the common air flow AC enters the leading edges 17a and the air inlet 22 to form the first and second air flows (A1, A2). Similarly, the common conduit 91 can be connected with the common air flow source 70 or positioned to receive the common air flow AC from the common air flow source 70.

Figure 13B:
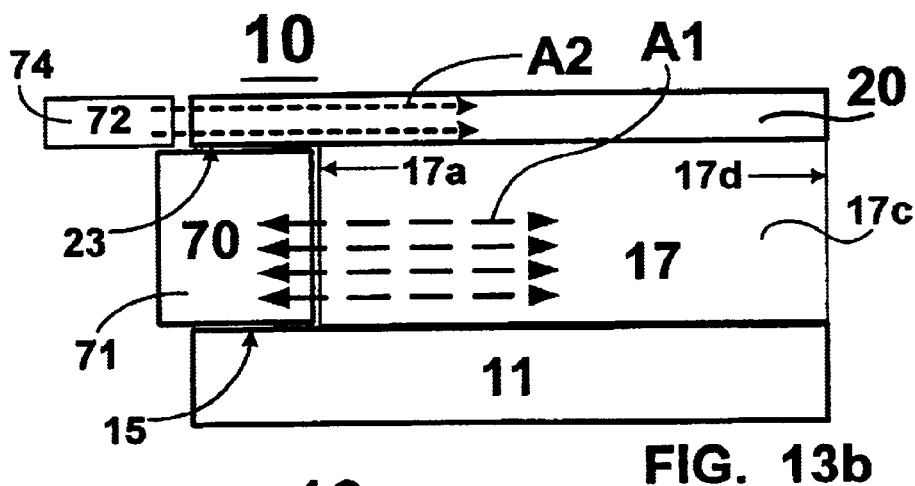
FIGS. 13b and 13c are a cross-sectional views depicting separate airflow sources for generating a first air flow and a second air flow according to the present invention.
Figure 13C:
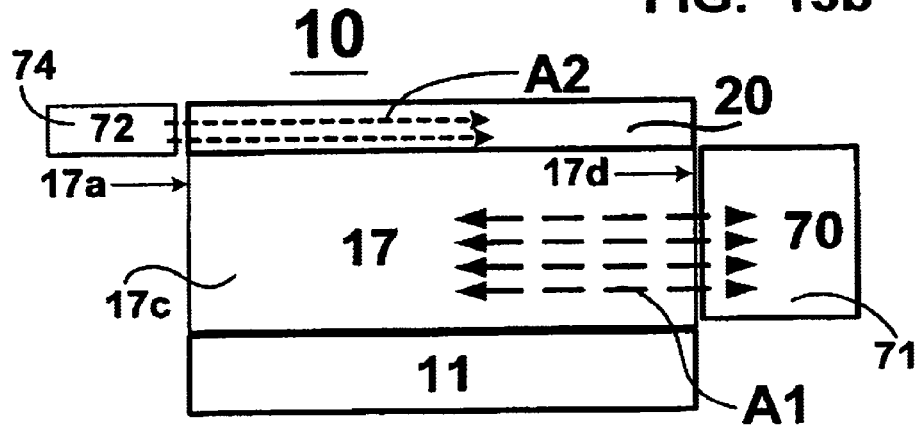

In FIGS. 13b and 13c, the first air flow A1 and the second air flow A2 are generated by separate air flow sources. The first air flow A1 is generated by a separate air flow source 70 and the second air flow A2 is generated by a separate air flow source 72. The separate air flow source 72 can include a housing 74 and is positioned so that second air flow A2 enters the air inlet 22. Similarly, the separate air flow source 70 is positioned so that first air flow A1 enters either the leading edges 17a (see FIG. 13b) or the trailing edges 17d of the fins 17 (see FIG. 13c).

Two of the separate air flow sources 70 can be used in a push-pull configuration (not shown) wherein one separate air flow source 70 is positioned at the leading edges 17a and another separate air flow source 70 is positioned at the trailing edges 17d. One of those two air flow sources 70 pushes air through the slots S and the other of the two pulls air through the slots S. On advantage of the push-pull configuration is that it provides redundant operation in the event one of the air flow sources 70 fails.

If only one separate air flow source 70 is used (as in FIGS. 13b and 13c), then that separate air flow source 70 can either push air through the slots S in a positive air flow or can pull air through the slots S in a negative air flow as indicated by the bi-directional dashed-arrows for the first air flow A1 (see FIGS. 13b and 13c).

Figure 17:
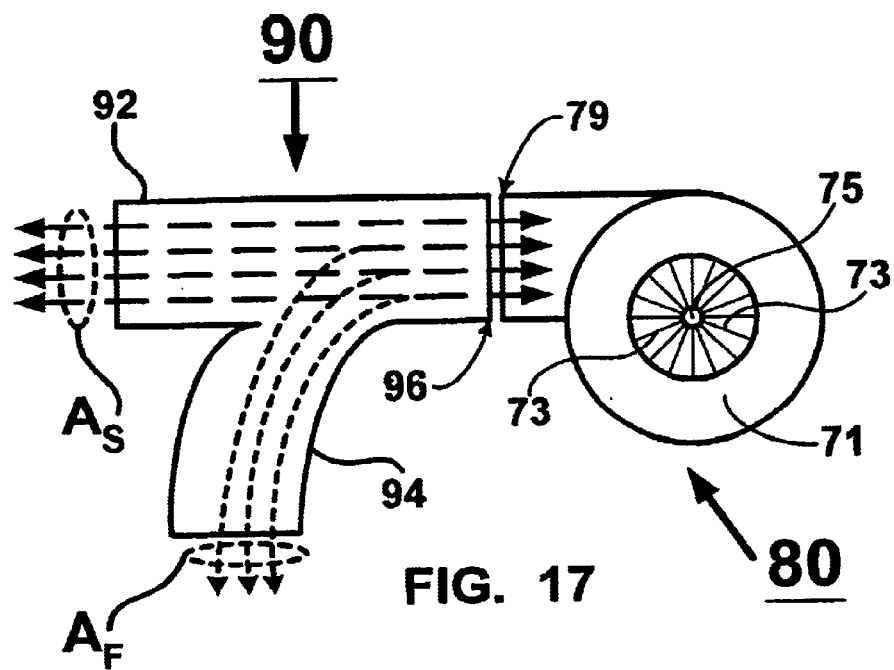
FIG. 17 is a schematic view of a system fan according to the present invention.

The separate air flow sources (70, 72) can be an integral fan or a system fan as was described above in reference to FIGS. 8 and 13a for an integral fan and FIG. 17 for a system fan. A conduit, such as the duct 90 of FIG. 17, can be used to channel the air flow from the system fan to the cooling device 10.

Figure 15:
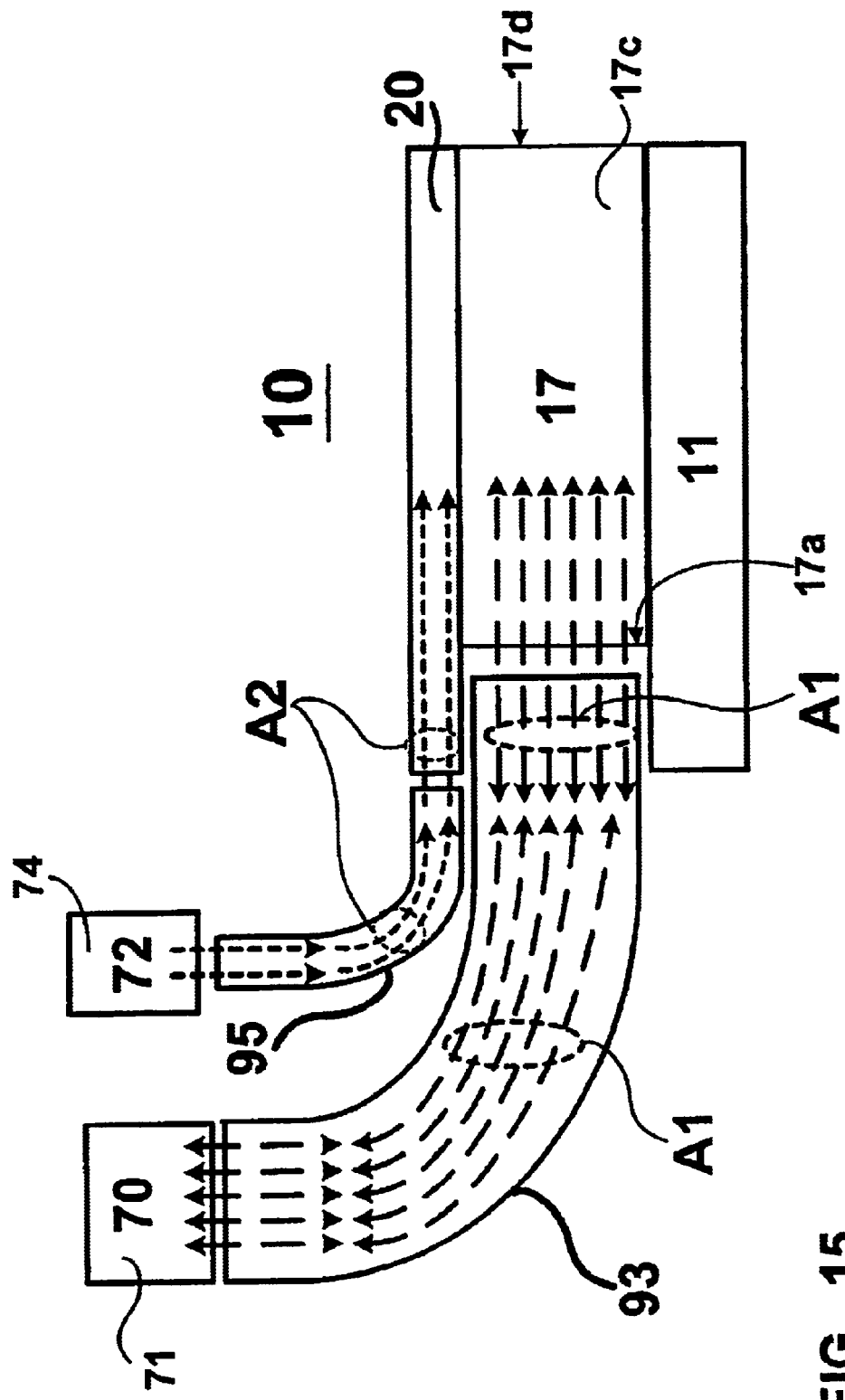
FIG. 15 is a cross-sectional view depicting a first conduit and a second conduit for communicating an air flow from separate air flow sources according to the present invention.

In FIG. 15, a first conduit 93 can be used to communicate the first air flow A1 between the separate air flow source 70 and the cooling device 10 (i.e. to the slots S). The first air flow A1 can be either a positive or a negative air flow as indicated by the bi-directional dashed-arrows for the first air flow A1. Moreover, a second conduit 95 can be used to communicate the second air flow A2 from the separate air flow source 72 to the cooling device 10 (i.e. to the air shower 20). The first and second conduits (93, 95) can be a duct, for example.

Figure 16C:
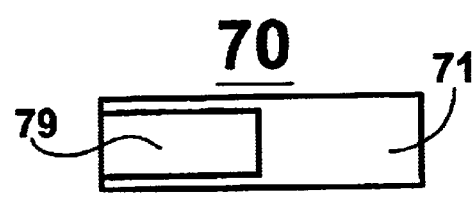

When separate air flow sources (70, 72) are used, with or without the conduits (93, 95), the air flow sources (70,72) can be a combination of a fan and a blower as illustrated in FIG. 16a and FIGS. 16b and 16c respectively. For instance, if the air inlet 22 has a rectangular aspect ratio as illustrated herein, then a blower (see FIGS. 16b and 16c) may be a better choice for the air flow source 72 because the output end 79 of the blower 70 has an aspect ratio that complements the aspect ratio of the air inlet 22. On the other hand, it the leading or trailing edges (17a, 17d) of the fins 17 have an aspect ratio that is square, then a fan may be a better choice for the air flow source 70 because many commercially available air flow sources such as fans have a housing that has a square aspect ratio.

In FIGS. 11a through 11e, the disrupter orifices 25 can include a variety of sidewall profiles. In FIG. 11a, the disrupter orifices 25 include a straight sidewall profile 25c that is substantially aligned with the vertical axis V (i.e. the sidewall surfaces 25c are substantially parallel with the vertical axis V so that the disrupter orifices 25 have a cylindrical bore). In FIG. 11b, the disrupter orifices 25 include a slope sidewall profile 25s. The slope sidewall profile 25s can either converge (see FIG. 11b) or diverge (not shown) in a direction towards the injector face 23. In FIG. 11c, the disrupter orifices 25 include an arcuate sidewall profile 25a. The arcuate sidewall profile 25a can either converge (see FIG. 11c) or diverge (not shown) in a direction towards the injector face 23.

The actual shape, size, and sidewall profiles for the disrupter orifices 25 will be application dependent and may depend on factors such as the material used for the injector face 23 and/or the air shower 20, the manufacturing process used to form the disrupter orifices 25, and the desired rate of flow (e.g. in CFM) for the second air flow A2 through the disrupter orifices 25, the inlet pressure at the air inlet 22, the size of the cooling device 10, and a thermal capacity of the heat mass 11, just to name a few. Moreover, a bore size of the disrupter orifices 25 (e.g. a diameter of the disrupter orifices 25) can be identical for all of the disrupter orifices 25 or the bore size can vary among the disrupter orifices 25.

As an example, the cylindrical sidewall profile 25c of the disrupter orifices 25 of FIG. 11a can be formed by a machining process such as a drilling or punching a material such as a metal or plastic. A bore of the disrupter orifices 25 can have any geometrical shape including but not limited to cylindrical shape, an elliptical shape, and a rectangular shape.

In FIG. 11d, the disrupter orifices 25 are disposed at an angle Δ with respect to the vertical axis V so that the second air flow A2 enters into the slots S in a direction that is not substantially aligned with the vertical axis V. The disrupter orifices include sidewall surfaces 25p that are disposed at the angle Δ. The disrupter orifices 25 can all have the same angle Δ or the angle Δ can vary among the disrupter orifices 25. The angle Δ can be used to effect the manner in which the second air flow A2 interacts with the first air flow A1 to induce turbulence in the slots S. The sidewall profiles 25p can be formed by a machining process such as drilling, for example.

Alternatively, in FIG. 11e, the disrupter orifices 25 can include a nozzle 31 positioned in the disrupter orifices 25. The nozzle 31 includes a nozzle orifice 35 with sidewall surfaces 35s. The nozzle orifice 35 is operative to communicate the second air flow A2 from the air impingement chamber 21 into the slots S. The sidewall surfaces 35s can be substantially straight, sloped, arcuate, or angled with respect to the vertical axis V as was described above in FIGS. 11a through 11d. The nozzles 31 can also be inserted into disrupter orifices 25 that are disposed at an angle Δ with respect to the vertical axis V as depicted in FIG. 11d. The disrupter orifices 25 can include sidewall surfaces 25b that are adapted to receive the nozzle 31. A bore size of the nozzle orifice 35 (i.e. a diameter of the nozzle orifice 35) can be identical for all of the nozzles 31 or the bore size can vary among the nozzles 31. Preferably, a protrusion of the nozzles 31 beyond the top edges 17t of the fins 17 should be limited in order to prevent a pressure drop in the first air flow A1.

Figure 12A:
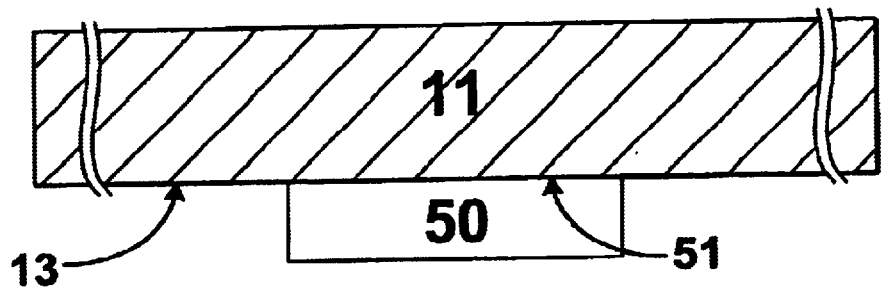
FIG. 12a is a cross-sectional view of a component connected with a mounting surface of a heat mass according to the present invention.

The heat mass 11 and a component to be cooled by the cooling device 10 can be thermally connected with each other in a variety of ways. In FIG. 12a, the heat mass 11 is in thermal communication with a component 50 by a direct connection between the mounting surface 13 of the heat mass 11 and the component 50. For instance, the mounting surface 13 can be in direct contact with a surface 51 of the component 50.

Figure 12B:
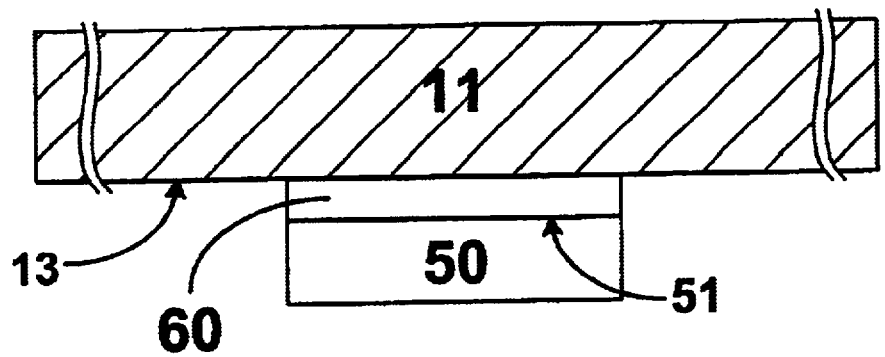
FIG. 12b is a cross-sectional view of a thermal interface material connected with a component and a mounting surface of a heat mass according to the present invention.

In FIG. 12b, a thermal interface material 60 is in contact with the mounting surface 13 and the component 50. The thermal interface material 60 thermally connects the heat mass 11 with the component 50 so that heat in the component 50 is thermally communicated into the heat mass 11 via the thermal interface material 60. For example, the thermal interface material 60 can be in contact with the mounting surface 13 and a surface 51 of the component 50.

Figure 12C:
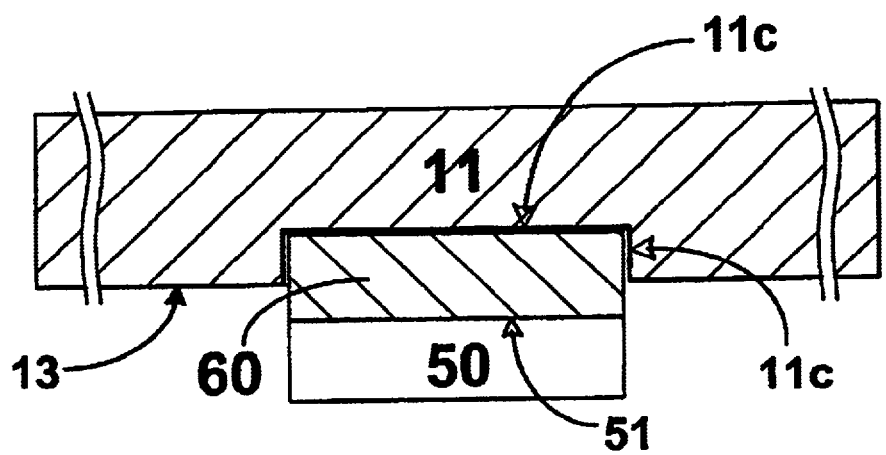
FIG. 12c is a cross-sectional view of a thermal interface material positioned in a cavity of a heat mass according to the present invention.

In FIG. 12c, the heat mass 11 includes a recessed portion that is inset from the mounting surface 13 to define a cavity 11c in the heat mass 11. A thermal interface material 60 is positioned in the cavity 11c and in contact with the heat mass 11. The thermal interface material 60 thermally connects the heat mass 11 with the component 50. For example, the thermal interface material 60 can be in contact with the heat mass 11 and a surface 51 of the component 50.

The thermal interface material 60 provides a thermally conductive path for waste heat from the component 50 to be thermally communicated to the heat mass 11. Additionally, the thermal interface material 60 can seal micro voids (i.e. small gaps) between the mounting surface 13 and the surface 51 thereby increasing-heat transfer from the component 50 to the heat mass 11.

Suitable materials for the thermal interface material 60 include but are not limited to a thermally conductive paste, a thermally conductive grease, silicone, paraffin, a phase transition material, graphite, a coated aluminum foil, and carbon fiber. The thermal interface material 60 can be screen printed, pasted, or glued to the mounting surface 13, for example. Alternatively, thermal interface material 60 can be screen printed, pasted, or glued to the surface 51 of the component 50.

The cooling device 10 can be made from a variety of materials. For example, the fins 17 can be made from a metal such as aluminum (Al) and the heat mass 11 can be made from a material such as copper (Cu). The fins 17 can be connected with the heat mass 11 by a brazing process. Alternatively, the heat mass 11 and the fins 17 can be a homogeneously formed unit (i.e. an integral unit) that can be formed by a process such as machining, casting, or molding. For instance, the heat mass 11 and the fins 17 can be machined from a metal stock of copper (Cu), aluminum (Al), or some other thermally conductive material.

The air shower 20 can be a separate component that is connected with the fins 17 using a fastener, glue, adhesives, a weld, or the like. Suitable materials for the air shower 20 include but are not limited to metal, a metal alloy, and plastic. For example, the air shower 20 can be made from a plastic material and the disrupter orifices 25 can be drilled into the injector face 23. The air shower 20 can be positioned over the top edges 17t of the fins 17 so that the disrupter orifices 25 are positioned over the slots S between the fins 17. The air shower 20 can be removably connected with the fins 17 (e.g. using fasteners) or it can be permanently connected with the fins 17 (e.g. using a weld). One advantage to using a plastic material for the air shower 20 is that most plastics are electrically non conductive and plastics can be manufactured at a low cost. A gasket, a sealant, or the like can be used to ensure a leak tight connection of the air shower 20 with the fins 17. Alternatively, the injector face 23 can be a separate component and the disrupter orifices 25 can be drilled, machined, casted, or otherwise formed in the injector face 23 followed by connecting the injector face 23 with the air shower 20 to form the air impingement chamber 21.

As an alternative, in FIG. 11f, a plurality of groves 23g are formed in the injector face 23. The grooves 23g have a shape that complements the top edges 17t so that the top edges 17t of the fins 17 can be inserted into the grooves 23g to form a leak tight seal. The grooves 23g and/or the top edges 17t can be coated with sealant material, a glue, or an adhesive to form the leak tight seal and/or to connect the air shower 20 with the fins 17.

Suitable materials for the duct or conduit (90, 91, 93, 95) used to communicate the first or second air flows (A1, A2) include but are not limited to plastics, metal, a metal alloy, and rubber. Care should be taken to ensure that any material selected for the air shower 20 or the duct/conduit (90, 91, 93, 95) will be able to withstand an expected temperature range of the cooling device 10.

As an example only, the cooling device 10 can include an air impingement chamber 21 with a height of about 10 mm (millimeters) and an injector face 23 having dimensions that correspond to the dimensions of the fins 17 at the top edges 17t. The injector face 23 is mounted to the top edges 17t. A fan (e.g. the integral common air flow source 70 of FIG. 8) having a flow rate of about 16 CFM was positioned to deliver its air flow into the air inlet 22 (i.e. the second air flow A2) and into the slots S between the leading edges 17a (i.e. the first air flow A1). The injector face 23 included sixty-five (65) disrupter orifices 25 with a majority of those disrupter orifices 25 having a position along the injector face 23 towards the trailing edges 17d (that is, a majority of the disrupter orifices 25 were populated toward the closed end 24). A pitch between adjacent disrupter orifices 25 was set at 2.5 mm and the disrupter orifices 25 had a diameter of 1.0 mm. The pitch was selected to ensure that the disrupter orifices 25 were positioned to fire the second air flow A2 into the slots S between adjacent fins 17. The heat mass 11 was made from copper (Cu) and the fins 17 were made from aluminum (Al). The fins 17 were brazed to the top surface 15 of the heat mass 11.

The mounting surface 13 of the heat mass 11 was connected with a steady and constant heat source (i.e. to simulate the component 50) and a stabilized temperature for the heat mass 11 was measured for two cases (with and without the air shower 20).

In the first case, with the air shower 20 positioned over the top edges 17t, the stabilized temperature for the heat mass 11 was 56.2° C. However, in the second case, without the air shower 20, the stabilized temperature for the heat mass 11 was 58.7° C. (i.e. the temperature of the heat mass 11 was 2.5° C. higher without the air shower 20 positioned over the top edges 17t of the fins 17).

Although several embodiments of the present invention have been disclosed and illustrated, the invention is not limited to the specific forms or arrangements of parts so described and illustrated. The invention is only limited by the claims.

What is claimed is:

1. A cooling device for dissipating heat from a component, comprising:
   a heat mass including a top surface and a mounting surface adapted to thermally connect the heat mass with the component;
   a plurality of fins connected with the top surface and substantially aligned with a vertical axis of the heat mass, each fin including opposed side surfaces, a top edge, a leading edge, and a trailing edge, the fins are spaced apart from one another to define a plurality of slots therebetween that are substantially aligned with a longitudinal axis of the heat mass; and
   an air shower including an air inlet extending into the air shower and terminating at a closed end to define an air impingement chamber therein, an injector face, and a plurality of disrupter orifices extending from the air impingement chamber to the injector face, the injector face is positioned adjacent to the top edges of the fins so that disrupter orifices are positioned over the slots; and
   wherein a second air flow enters the air impingement chamber through the air inlet and exits the air impingement chamber through the disrupter orifices, the second air flow enters the slots and impinges on a first air flow flowing through the slots, the second air flow induces turbulence in the first air flow and the turbulence is operative to disrupt a thermal boundary layer in the first air flow thereby increasing a rate of heat transfer from the fins and the heat mass to the first air flow.

2. The cooling device as set forth in claim 1 wherein the second air flow has a lower temperature than a bulk fluid temperature of the first air flow and the second air flow is operative to reduce the bulk fluid temperature of the first air flow thereby increasing a caloric heat transfer rate from the fins and the heat mass to the first air flow.

3. The cooling device as set forth in claim 1 wherein the heat mass is thermally connected with the component by a direct connection between the mounting surface and the component.

4. The cooling device as set forth in claim 1 and further comprising:
   a thermal interface material in contact with the mounting surface and with the component and operative to thermally connect the heat mass with the component.

5. The cooling device as set forth in claim 1 and further comprising:
   a recessed portion inset from the mounting surface and defining a cavity in the heat mass; and
   a thermal interface material positioned in the cavity and in contact with the heat mass and operative to thermally connect the heat mass with the component.

6. The cooling device as set forth in claim 1, wherein the first air flow and the second air flow are generated by a common air flow source.

7. The cooling device as set forth in claim 6, wherein the common air flow source is an air flow source selected from the group consisting of an integral fan and a system fan.

8. The cooling device as set forth in claim 6 and further comprising a common conduit for communicating the first air flow and the second air flow between the common air flow source and the cooling device.

9. The cooling device as set forth in claim 1, wherein the first air flow and the second air flow are generated by separate air flow sources.

10. The cooling device as set forth in claim 9, wherein the separate air flow sources comprise an air flow source selected from the group consisting of an integral fan and a system fan.

11. The cooling device as set forth in claim 9, wherein the separate air flow source for the first air flow is positioned adjacent to a selected one of the leading edges of the fins or the trailing edges of the fins.

12. The cooling device as set forth in claim 11, wherein the separate air flow source for the first air flow generates an air flow selected from the group consisting of a positive air flow and a negative air flow.

13. The cooling device as set forth in claim 9, wherein the separate air flow source for the first air flow generates an air flow selected from the group consisting of a positive air flow and a negative air flow.

14. The cooling device as set forth in claim 9 and further comprising a first conduit for communicating the first air flow between the separate air flow source and the cooling device.

15. The cooling device as set forth in claim 14, wherein the separate air flow source for the first air flow generates an air flow selected from the group consisting of a positive air flow and a negative air flow.

16. The cooling device as set forth in claim 9 and further comprising a second conduit for communicating the second air flow from the separate air flow source to the cooling device.

17. The cooling device as set forth in claim 1, wherein the heat mass and the plurality of fins are a homogeneously formed unit.

18. The cooling device as set forth in claim 1, wherein the disrupter orifices include a sidewall profile selected from the group consisting of a straight sidewall profile, a sloped sidewall profile, and an arcuate sidewall profile.

19. The cooling device as set forth in claim 1, wherein the disrupter orifices are disposed at an angle relative to the vertical axis.

20. The cooling device as set forth in claim 1 and further comprising a nozzle positioned in a selected one or more of the disrupter orifices, the nozzle including a nozzle orifice operative to communicate the second air flow from the air impingement chamber into the slots.

21. The cooling device as set forth in claim 1, wherein the leading edges of the fins are inset from the air inlet of the air shower and a portion of the disrupter orifices are positioned outward of the leading edges and the second air flow flowing through the disrupter orifices that are positioned outward of the leading edges disrupts the first air flow and generates a pre-turbulence in the first air flow before the first air flow enters the slots at the leading edges.

22. The cooling device as set forth in claim 1, wherein the trailing edges of the fins are inset from the closed end of the air shower and a portion of the disrupter orifices are positioned outward of the trailing edges and the second air flow flowing through the disrupter orifices that are positioned outward of the trailing edges disrupts the first air flow and generates a pre-turbulence in the first air flow before the first air flow enters the slots at the trailing edges.

23. The cooling device as set forth in claim 1, wherein the disrupter orifices are more densely populated along the injector face at a position selected from the group consisting of a position proximate the leading edges of the fins and a position proximate the trailing edges of the fins.

* * * * *